(12) United States Patent
Buscema

(10) Patent No.: US 8,666,707 B2
(45) Date of Patent: Mar. 4, 2014

(54) MODEL SIMULATING THE EVOLUTIONARY DYNAMICS OF EVENTS OR PROCESSES AND METHOD OF GENERATING A MODEL SIMULATING THE EVOLUTIONARY DYNAMICS OF EVENTS OR PROCESSES

(75) Inventor: Paolo Massimo Buscema, Rome (IT)

(73) Assignees: CSI Ricerca & Ambiente SRL, Rome (IT); Semeion Centro Ricerche, Rome (IT)

( * ) Notice: Subject to any disclaimer, the term of this patent is extended or adjusted under 35 U.S.C. 154(b) by 587 days.

(21) Appl. No.: 12/969,887

(22) Filed: Dec. 16, 2010

(65) Prior Publication Data

US 2012/0158373 A1 Jun. 21, 2012

(51) Int. Cl.
| G06F 7/60 | (2006.01) |
| G06F 17/10 | (2006.01) |
| G06F 17/50 | (2006.01) |

(52) U.S. Cl.
CPC .................................. *G06F 17/5018* (2013.01)
USPC .......................................................... 703/2

(58) Field of Classification Search
USPC .................... 703/2, 9–10; 345/421; 702/5
See application file for complete search history.

(56) References Cited

U.S. PATENT DOCUMENTS

| 5,276,770 A * | 1/1994 | Castelaz ........................ 706/25 |
| 6,271,856 B1 * | 8/2001 | Krishnamurthy ............. 345/581 |
| 7,658,618 B2 * | 2/2010 | Ochiai ............................ 439/66 |
| 2004/0148148 A1 * | 7/2004 | Butler et al. ................... 703/10 |
| 2009/0083356 A1 * | 3/2009 | Welkie .......................... 708/443 |

OTHER PUBLICATIONS

Tan et al., "Adaptive Fuzzy Modeling of Nonlinear Dynamical Systems". Pergamon. 1994. p. 637-643.*

* cited by examiner

*Primary Examiner* — Eunhee Kim
(74) *Attorney, Agent, or Firm* — Themis Law

(57) ABSTRACT

A model simulating the evolutionary dynamics of events or processes includes a non-linear adaptive mathematical system simulating spatial and temporal dynamics by using measured values of parameters describing the evolutionary condition of an event or process at different times. The model enables the definition of a n-dimensional array of points in a n-dimensional reference system having an axis that represents the values of the parameters being measured. The displacements of each of the points are computed as a function of their displacements in the array of points between a first time a second time and as a function of the distance of each of the points of the array from each of the points representing the measured parameters. The evolution of the event and or the model in time is visualized by displaying the points of the array of points at different times.

20 Claims, 21 Drawing Sheets

TWISTING USING FROM STEP N=0 AND TO STEP N=6

GEOMETRICAL POINTS AND THE DYNAMICS OF DISTANCES

TWISTING THEORY APPLIED TO A REAL EPIDEMIC DENGUE FEVER – BRAZIL

FIG. 4A

| ID | PLACE NAME | LAT AND LONG | | NUMBER OF NEW SUBJECTS INFECTED AT EACH STEP | | | | | | | TOTAL |
|---|---|---|---|---|---|---|---|---|---|---|---|
| | | X | Y | N=0 | N=1 | N=2 | N=3 | N=4 | N=5 | N=6 | |
| 1 | POPULINA | -50.5300 | -19.9500 | 0 | 0 | 0 | 0 | 19 | 12 | 1 | 32 |
| 2 | OUROESTE | -50.3700 | -20.0000 | 0 | 0 | 2 | 6 | 5 | 0 | 0 | 13 |
| 3 | INDIAPORA | -50.2900 | -19.9800 | 0 | 0 | 0 | 0 | 5 | 0 | 0 | 5 |
| 4 | PAULO_DE_FARIA | -49.3800 | -20.0300 | 1 | 30 | 67 | 43 | 40 | 14 | 1 | 196 |
| 5 | CARDOSO | -49.9100 | -20.0800 | 1 | 1 | 4 | 2 | 4 | 1 | 0 | 13 |
| 6 | RIOLANDIA | -49.6800 | -19.9900 | 1 | 2 | 11 | 38 | 24 | 9 | 2 | 87 |
| 7 | TURMALINA | -50.4700 | -20.0500 | 0 | 0 | 0 | 0 | 1 | 0 | 0 | 1 |
| 8 | MACEDONIA | -50.1900 | -20.1400 | 0 | 0 | 0 | 2 | 3 | 1 | 0 | 6 |
| 9 | DOLCINOPOLIS | -50.5100 | -20.1200 | 0 | 0 | 0 | 0 | 0 | 1 | 0 | 1 |
| 10 | PEDRANOPOLIS | -50.1100 | -20.2400 | 0 | 0 | 2 | 0 | 0 | 0 | 0 | 2 |
| 11 | FERNANDOPOLIS | -50.2400 | -20.2800 | 0 | 11 | 73 | 205 | 201 | 35 | 17 | 542 |
| 12 | ESTRELA D'OESTE | -50.4000 | -20.2800 | 0 | 1 | 0 | 3 | 2 | 2 | 0 | 8 |
| 13 | S._FE_DO_SUL | -50.9200 | -20.2100 | 0 | 0 | 0 | 5 | 5 | 1 | 1 | 12 |
| 14 | JALES | -50.5400 | -20.2600 | 0 | 1 | 5 | 16 | 4 | 1 | 0 | 27 |
| 15 | GUARACI | -48.9400 | -20.4900 | 2 | 0 | 1 | 6 | 4 | 0 | 0 | 11 |
| 16 | AMERICO_DE_CAMPOS | -49.7300 | -20.2900 | 0 | 0 | 0 | 0 | 1 | 0 | 0 | 1 |
| 17 | ICEM | -49.1900 | -20.3400 | 0 | 0 | 0 | 1 | 3 | 0 | 2 | 6 |
| 18 | COSMORAMA | -49.7700 | -20.4700 | 0 | 0 | 0 | 2 | 4 | 3 | 1 | 10 |
| 19 | NOVA_GRANADA | -49.3100 | -20.5300 | 0 | 0 | 1 | 3 | 4 | 0 | 0 | 8 |
| 20 | MERIDIANO | -50.1700 | -20.3500 | 0 | 0 | 0 | 1 | 0 | 0 | 0 | 1 |
| 21 | VOTUPORANGA | -49.9700 | -20.4200 | 2 | 4 | 9 | 7 | 10 | 3 | 4 | 39 |
| 22 | TANABI | -49.6400 | -20.6200 | 0 | 0 | 1 | 0 | 12 | 5 | 1 | 18 |
| 23 | APARECIDA D'OESTE | -50.8800 | -20.4400 | 0 | 0 | 0 | 0 | 0 | 1 | 0 | 1 |
| 24 | GENERAL_SALGADO | -50.3600 | -20.6400 | 0 | 0 | 0 | 7 | 17 | 3 | 1 | 28 |
| 25 | AURIFLAMA | -50.5500 | -20.6800 | 0 | 0 | 0 | 0 | 3 | 0 | 0 | 3 |
| 26 | IPIGUA | -49.3800 | -20.6500 | 0 | 0 | 0 | 0 | 4 | 0 | 0 | 4 |
| 27 | OLIMPIA | -48.9100 | -20.7300 | 1 | 8 | 55 | 242 | 356 | 98 | 12 | 772 |

| 28 | MONTE_APRAZIVEL | -49.7100 | -20.7700 | 0 | 0 | 6 | 20 | 18 | 18 | 0 | 62 |
| 29 | GUAPIACU | -49.2200 | -20.7900 | 0 | 0 | 1 | 2 | 5 | 2 | 2 | 12 |
| 30 | BALSAM° | -49.5800 | -20.7300 | 0 | 0 | 0 | 0 | 0 | 2 | 0 | 2 |
| 31 | SAO_JOSE_DO_RIO_PRETO | -49.3700 | -20.8200 | 30 | 142 | 583 | 2002 | 2781 | 690 | 188 | 6416 |
| 32 | POLONI | -49.8200 | -20.7800 | 0 | 0 | 0 | 2 | 12 | 9 | 3 | 26 |
| 33 | MIRASSOL | -49.5200 | -20.8100 | 2 | 21 | 171 | 550 | 618 | 159 | 44 | 1565 |
| 34 | MACAUBAL | -49.9600 | -20.8000 | 0 | 0 | 0 | 1 | 2 | 2 | 0 | 5 |
| 35 | SEVERINIA | -48.8000 | -20.8000 | 0 | 0 | 0 | 0 | 4 | 0 | 0 | 5 |
| 36 | NEVES_PAULISTA | -49.6300 | -20.8400 | 0 | 0 | 0 | 13 | 32 | 11 | 2 | 58 |
| 37 | UCHOA | -49.1700 | -20.9500 | 0 | 0 | 0 | 0 | 2 | 6 | 0 | 10 |
| 38 | TABAPUA | -49.0300 | -20.9600 | 10 | 23 | 7 | 6 | 3 | 2 | 2 | 51 |
| 39 | CAJOBI | -48.8000 | -20.8800 | 2 | 2 | 84 | 179 | 39 | 1 | 0 | 307 |
| 40 | CEDRAL | -49.2600 | -20.9000 | 0 | 0 | 0 | 0 | 3 | 2 | 1 | 6 |
| 41 | JACI | -49.5700 | -20.8800 | 0 | 0 | 1 | 5 | 6 | 2 | 0 | 14 |
| 42 | BADY_BASSITT | -49.4400 | -20.9100 | 0 | 0 | 1 | 8 | 11 | 6 | 2 | 28 |
| 43 | EMBAUBA | -48.8300 | -20.9800 | 0 | 0 | 0 | 1 | 1 | 0 | 0 | 2 |
| 44 | JOSE_BONIFACIO | -49.6800 | -20.9500 | 0 | 0 | 1 | 20 | 15 | 9 | 6 | 51 |
| 45 | IBIRA | -49.2400 | -21.0800 | 0 | 0 | 0 | 0 | 1 | 0 | 0 | 1 |
| 46 | POTIRENDABA | -49.3700 | -21.0400 | 0 | 0 | 0 | 0 | 1 | 5 | 1 | 7 |
| 47 | CATANDUVA | -48.9700 | -21.1300 | 0 | 1 | 14 | 38 | 43 | 14 | 2 | 111 |
| 48 | CATIGUA | -49.0500 | -21.0400 | 0 | 0 | 20 | 41 | 6 | 1 | 0 | 69 |
| 49 | PALM_PAULISTA | -48.8300 | -21.0800 | 0 | 0 | 0 | 1 | 1 | 0 | 0 | 2 |
| 50 | URUPES | -49.2900 | -21.2000 | 0 | 0 | 0 | 0 | 7 | 2 | 0 | 9 |
| 51 | IPAPUA | -49.4000 | -21.2700 | 0 | 0 | 2 | 0 | 1 | 1 | 0 | 3 |
| 52 | ADOLFO | -49.6400 | -21.2300 | 0 | 0 | 0 | 1 | 1 | 0 | 0 | 2 |
| 53 | SANTA_ADELIA | -48.8000 | -21.2400 | 0 | 0 | 0 | 1 | 3 | 0 | 0 | 4 |
| 54 | ITAJOBI | -49.0500 | -21.3100 | 0 | 0 | 0 | 1 | 0 | 0 | 0 | 1 |

FIG. 4B

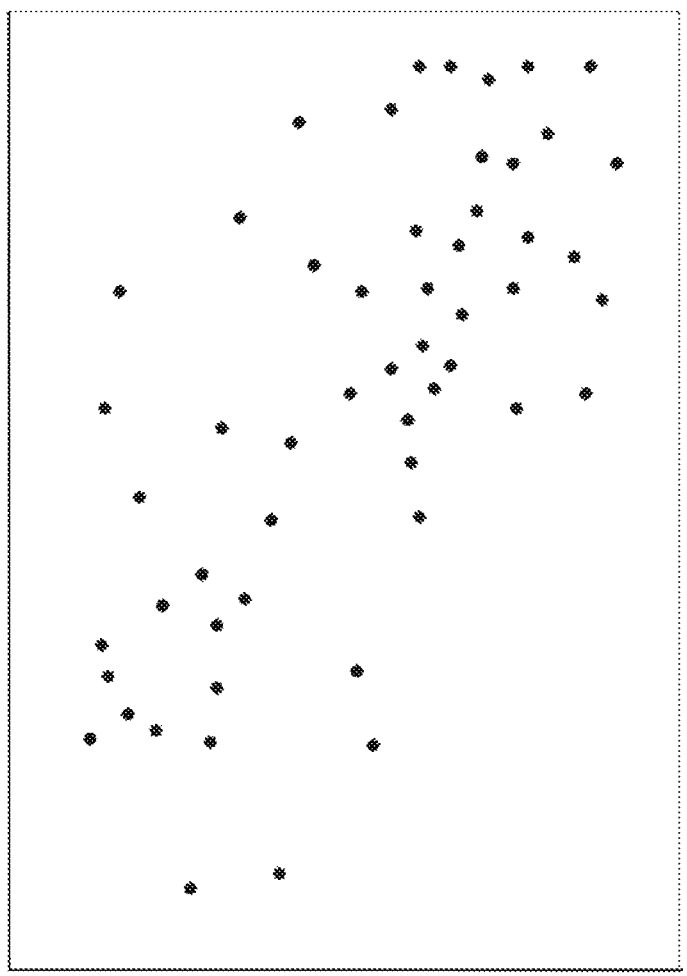

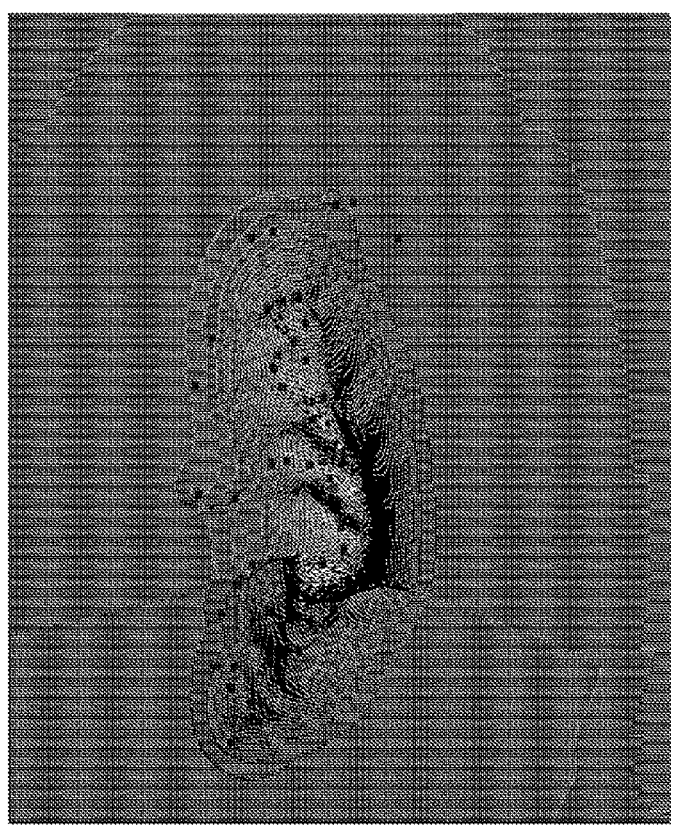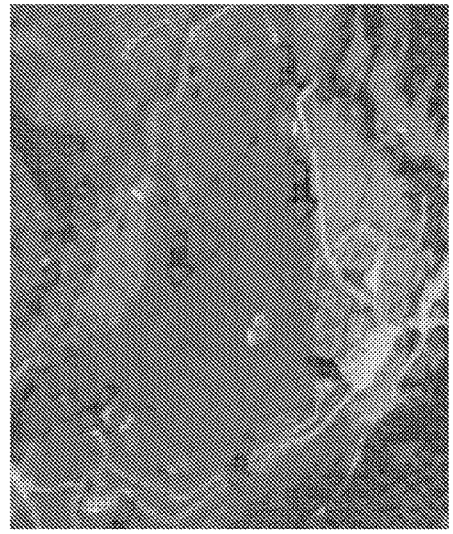
FIG. 10

MODEL SIMULATING THE EVOLUTIONARY DYNAMICS OF EVENTS OR PROCESSES AND METHOD OF GENERATING A MODEL SIMULATING THE EVOLUTIONARY DYNAMICS OF EVENTS OR PROCESSES

FIELD OF THE INVENTION

The invention relates to a model simulating dynamics of events or processes and a method of generating such a model.

More particularly, the invention relates to models, in which the event or process takes place in a space that can be described with a map, especially a two or three dimensional map.

In to an embodiment of the invention, the model is directed to the simulation of a process or of an event which takes place in a geophysical territory, the territory being described by a two or three dimensional geometrical map.

BACKGROUND OF THE INVENTION

The simulation of the dynamical behavior of processes or events is greatly important in many technical fields. Practically, each control logic or control device according to the current state of the art is developed according to a simulation of the functionalities of the device by means of a virtual model. Control processes are also simulated by virtual models, which simulate the behavior of the control logic in several operative conditions such that the correct configuration of the control logic can be tested relatively to a proper way of functioning before a control device operating with such control logic is produced.

Virtual models simulating the behavior of devices or plants or simulating the evolution of processes or events both in time and in space are also relevant for the cognitive processes of artificial intelligence since a device provided with artificial intelligence can evaluate the consequences in future times of events, of which some parameters describing the effects of those events have been measured at different times.

This kind of technology enhances the power of artificial intelligence in evaluating events or processes and in taking decisions about actions or operations to be carried out based on the evaluation of data acquired by measuring physical or chemical parameters of a certain environment.

Events or processes but also devices, plants or control systems can be described by physical and/or chemical parameters. Those parameters relate to the condition of the event, of the process or of the device, of the plant or the control system and/or to the functional or evolution steps which will be carried out as a response to certain status conditions. Thus, it is clear that a space can be constructed representing the event, the process or the device, the plant, and the control system in relation to certain status or functional parameters. Such status or functional behavior or the evolution of the event or the process can be described by means of a topographic representation.

Similarly, considering a device or a plant or a control system, these have a two or three dimensional structure which can be described by functional or constructive schemes, in which single operative units or organs are represented and their connections, such that the behavior of the system, of the device or of the plant can be represented by the changes in the status or functional parameters of the single operative units or organs. That plant, that device or system already has a topographic structure related to the positions of the operative units, which could serve as a space for representing the system. In a further improvement, however, the space to be used is a space defined by a certain number of status or functional parameters of a certain number of operative organs or units, in which a point in this space represents a status condition or a functional condition at a certain time of a certain operative unit or organ. When the status or functional conditions changes in time, the point representing the status and/or functional condition of a certain operative unit or organ changes its place in that space.

Consider, for example, a system in which the status condition of each organ or unit provided in the system is defined by P, V and T (Pressure, Volume, Temperature) parameters. A three dimensional space can be constructed in which the status or functional condition of each unit or organ is described by a point in said space, the coordinate of that point being the measured or imposed values for pressure, volume and temperature at said unit or organ. Thus, by representing each operative unit or organ by a different point, positioned in the space according to the coordinate set equal to the measured or imposed values for pressure, volume and temperature at said unit or organ, a status map at a certain time of the entire system can be generated. Repeating such measures in time enables following evolution status.

If the system has a great number of operative organs or units, it is a very high burden to measure the values of pressure, volume and temperature at each of those operative organs or units.

SUMMARY OF THE INVENTION

An object of the present invention is to provide a model that simulates dynamics of events or processes and a method of generating such a model, which uses at least two measurements of values of parameters describing a process, the two measurements being carried out a different times, to calculate the dynamic evolution of the event or process in time and space and give a clearer information on the dynamics of the event or process in the period, over which such measurements have been made and also at future times.

The term evolution in the present description and in the claims indicates prediction and evolution of the dynamic behavior of a system.

The measurements of the parameters describing the event or process can be taken at more than two different times, so that for each parameter a sequence of measurement values taken at different times is provided, the sequence being used to generate the model.

The model according to the present invention consists in a non linear adaptive mathematical system simulating the spatial and temporal dynamics of the events or processes by using measured values of a certain number of parameters describing the evolutionary condition of the event or process at certain different times.

The values of those parameters are measured at a first time and at least a second time different from and following the first time or at several times of a sequence of times of measurement.

The model defines a n-dimensional array of points in a n-dimensional reference system whose axis represents the values of the parameters being measured. In that array, those parameters are represented by special points in the array of points.

The displacements of each of the points of such array of points is computed as a function of the displacements in the array of points of each of the points representing the measured parameter values between a first time of measurement and at least a following second time of measurement, and as a function of the distance of each of the points of the array of points from each of the points representing the measured parameters.

The evolution of the event and or the model in time is visualized by displaying the points of the array of points at different times.

In one embodiment, the n-dimensional array of points is represented by a n-dimensional grid, in which the points of the array of points are the crossing points of the lines delimiting the meshes of the grid and the evolutionary condition of the event or process at a certain time is visualized as the distortion of the grid determined by the changes in the relative position of the points of the array from the starting position, in which the points of the array are equally spaced one from the other in relation to the position of said points of the array of points computed at that certain time.

For the grid, a certain mesh size can be set, while for the array of points the distance of a point in the array from neighboring points directly beside that point can also be set among several different sizes.

In one embodiment, the array of points is two or three dimensional array.

Similarly the grid can be two or three dimensional.

The above model is able to infer how each point of the array or of the grid will modify its coordinates at each temporal step when any point in the grid representing a measured parameter will move toward its new position.

The model is particularly designed and useful for describing the evolution in time and space of events or processes in a geographical region, the space being the three dimensional geophysical space of the territory of that geographical region.

The model for generating a model simulating the evolutionary dynamics of events or processes according to the present invention includes a non linear adaptive mathematical system simulating the spatial and temporal dynamics of an event or process by using measured values of a certain number of parameters describing the evolutionary condition of the event or process at certain different times.

The values of the parameters are measured at a first time and at least a second time different from and following the first time.

A n-dimensional array of points is defined in a n-dimensional reference system having an axis that represents the values of the parameters being measured, said parameters being represented in the array by special points in that array of points.

The displacements of each of the points of the array of points are computed as a function of the displacements in the array of points of each of the points representing the measured parameter values between a first time of measurement and at least a following second time of measurement and as a function of the distance of each of the points of the array of points from each of the points representing the measured parameters.

The evolution of the event and or the model in time is visualized by displaying the points of the array of points at different times.

The model and the method use mathematical equations which will be described in greater detail in the following description.

Additional embodiments or improvements are disclosed in the dependent claims and also in the following description.

In relation to the above features of a model and of a method according to the present invention, it is to be considered that, as mentioned above, instead of measuring the parameters, at least some of said parameters can be set by the user at a certain value. This enables a testing of the evolution of the behavior of a process or of an event or of a device, plant or system in certain conditions which are virtually set by the user. In this way it is possible to predict how the process, the event or the system will behave if such imposed conditions will occur.

Further in relation to the above and also to the following description, each point representing a measured condition of the event or process or of a unit or organ of a device, or plant or system in the n-dimensional map can be described by a vector or by a matrix of parameters.

The model according to the present invention, not only helps in predicting the evolution of the dynamic behavior of the system represented by the model, but also provides information about where the event or process, or the more significant behaviors of the device, the plant or the system will occur and in determining the limits of the effects of this significant behavior.

BRIEF DESCRIPTION OF THE DRAWINGS

FIGS. 4A and 4B illustrate a table of measured data relating to the propagation of the epidemic Dengue fever.

FIGS. 5A and 5B illustrate the points at which the number of infected persons is measured at different times and the regions of the territory where the epidemic has propagated, while the different grey shades indicate different level of infection according to the table of FIG. 4 at the points of the left side of FIG. 5.

FIGS. 6A, 6B, 7A and 7B illustrate the map visualizing the propagation model of the epidemic on the territory by means of the grid distorted by the mathematical engine of the model at different times or steps of evolution.

FIG. 10 is an enlargement of a region of the grid and of the map according to FIG. 8.

DETAILED DESCRIPTION OF THE INVENTION

A model and a method according to the invention operate by means of a mathematical system of equations which will be described hereinafter with the help of FIGS. 1 and 2.

The evolution in time and space of a process or event can be described as the displacement of points representing certain values of parameters in a certain space.

The mathematical model can be best understood by analyzing at first a two dimensional embodiment. A three dimensional embodiment represents instead an extension of the equations in three dimensions.

Let us suppose a two dimensional finite and regular grid of P discrete points of a discrete geometry. The points P forms an array of points.

Let us suppose a set M of these points, each able to follow within the grid a discrete path in T temporal steps. These points are the points representing measured parameters at least at two different times or the points at which at least at two different times certain parameters are measured, those parameters being specific parameters for describing the process or event.

Let us name the moving points of the set M Entities (E) and all the points of the grid Geometrical points (G).

We define as trajectory the minimal path at each temporal step.

Each trajectory of each Entity is assumed to be linear. The whole path of each Entity has no constraints, but has to work within the grid boundaries.

An object of the invention can be reformulated as defining a Model able to infer how each geometrical point of the grid will modify its coordinates at each temporal step when any Entity of the grid will move toward its new position.

Figure 1:
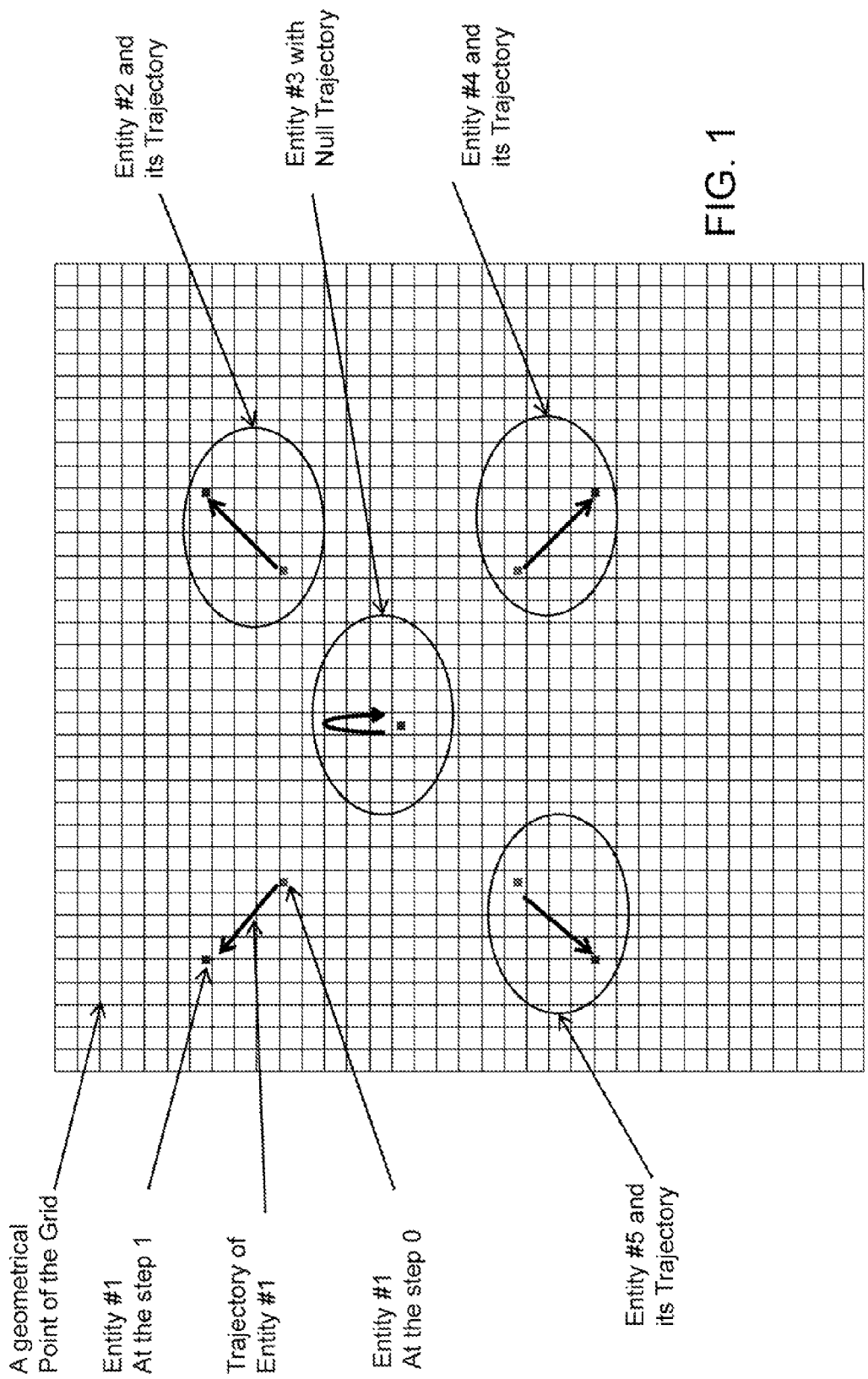
FIG. 1 illustrates an example of a grid describing the space according to the present invention, on which several points are positioned that correspond to measured values of parameters at a certain instant. The propagation or evolution in time and space of the event or process is evaluated by means of the displacement of such points according to the values acquired in at least a second measurement at a second time, wherein the measured parameters of the present example are the positions of the point on the grid.

FIG. 1 visualizes the above definitions.

The two dimensional space is represented by the grid 1. The geometrical points P, which are the points of the array of points, are the crossing points of the horizontal lines with the vertical lines of the grid 1. Five entity points E1 to E5 are illustrated with a position on the grid at a first time of measurement of specific parameters of the event at the corresponding entity E1, up to E5, and at a second time of measurement of such parameter. The displacement of each entity on the grid resulting from the results of the two measurements of the parameters is the trajectory represented by the arrow A1 to A5.

Figure 2:
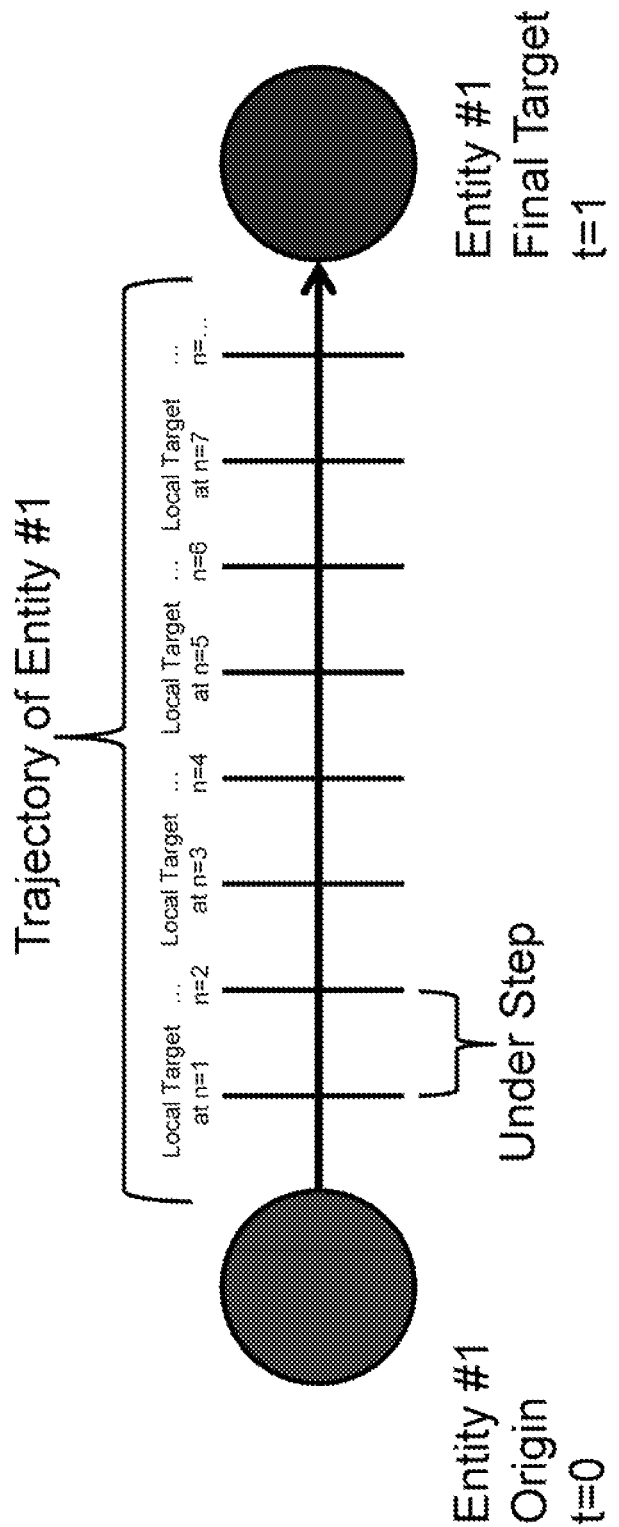
FIG. 2 illustrates a schematic view of a trajectory of a point corresponding to a measured parameter at two times, i.e. the position of the point at a first time and at a later time.
Figure 3:
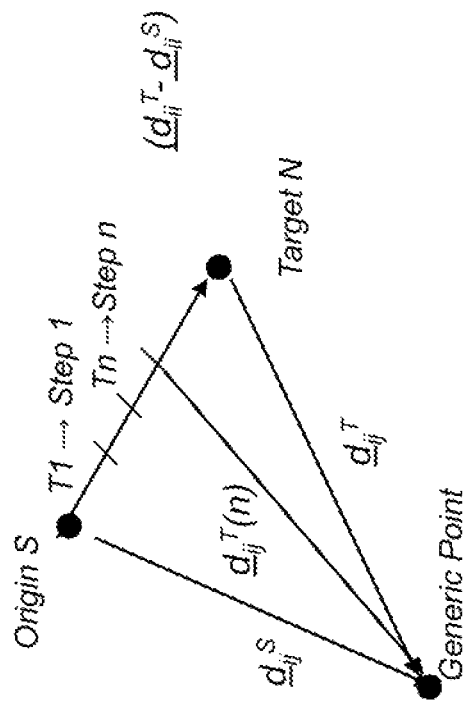
FIG. 3 illustrates a diagram of the distance equations $d_{ij}^{S}(n)$, $d_{ij}^{T}(n)$

According to FIG. 2, any trajectory of each Entity is divided in N linear under-steps of equal length.

Furthermore each entity within its trajectory is defined by one Origin location (its original X and Y coordinates) and a Moving Local Target, defined by each under-step.

FIG. 2 illustrates the division of the trajectory from the origin to the target of the entity point 1 in seven under-steps.

In the present model the distances of each geometrical point G from the Origin and from the Local Target of any Entity at each under step (n) is considered for calculating the dynamics of the event or process in space and time.

In the two dimensional model and according to the above definitions, such distances are defined by the following equations:

$$d_{ij}^{S}(n) = \sqrt{(x_i^P(n) - x_j^S)^2 + (y_i^P(n) - y_j^S)^2}$$

$$d_{ij}^{T}(n) = \sqrt{(x_i^P(n) - x_j^T(n))^2 + (y_i^P(n) - y_j^T(n))^2}.$$

where:

$x_i^P(n)$, $y_i^P(n)$ are the coordinates of a generic point $P_i$ of the grid at the understep (n), when n=o the point $P_i$ is lined up with the regular grid.

$x_j^S$, $y_j^S$ are the origin coordinates of each entity point (j), which means, the parameter values at the time of the first measurement or the point at which the parameter values have been measured at the time of the first measurement;

$x_j^T(n)$, $y_j^T(n)$ are the local target coordinates of each entity point (j), at any understep (n). When n=0, the entity point lies on its origin, while when n=N the entity point has completed its trajectory.

$d_{ij}^S(n)$ is the distance of a generic point $P_i$ from the origin of any entity point j at the understep (n).

$d_{ij}^T(n)$ is the distance of a generic point (i) from the local target (n) of any entity point j at the understep (n).

The model further considers that at each understep (n) a quantity of Potential energy $\Delta(n)$ is computed according to the following equations:

$$d_{i,j_{(n)}}^{S} = \sqrt{(x_{i_{(n)}}^P - x_j^S)^2 + (y_{i_{(n)}}^P - y_j^S)^2} \quad (1)$$

$$d_{i,j_{(n)}}^{T} = \sqrt{(x_{i_{(n)}}^P - x_j^T)^2 + (y_{i_{(n)}}^P - y_j^T)^2} \quad (2)$$

$$\Delta_{i_{(n)}} = \sum_{j=1}^{N} \exp\left(-\frac{(d_{i,j_{(n)}}^S + d_{i,j_{(n)}}^T)}{\alpha}\right) \cdot |d_{i,j_{(n)}}^S - d_{i,j_{(n)}}^T|. \quad (3)$$

where $d_{i,j_{(n)}}^{S} = d_{ij}^{S}(n);$ $d_{i,j_{(n)}}^{T} = d_{ij}^{T}(n);$ $x_{i_{(n)}}^{P} = x_i^{P}(n);$ $y_{i_{(n)}}^{P} = y_i^{P}(n);$ $x_{j_{(n)}}^{T} = x_j^{T}(n);$ $y_{j_{(n)}}^{T} = y_j^{T}(n).$ During the evolution of the event or process, the potential energy defined by the above equation is considered converted in kinetic energy so that the coordinates of the points $P_i$ will be updated with the $\Delta(n)$ quantity according to the direction along the x and y axis defining the two dimensional space of the grid.

The computation of the position of the points of the array of points or of the grid at a certain time as a function of the measured values of the parameters at least at a first and at a second following or successive time are carried out according to the following equations:

$$x^{[p]}_{i_{(n+1)}} = x^{[p]}_{i_{(n)}} + \Delta_{i_{(n)}} \quad \delta x^{[p]}_{i_{(n)}} < 0;$$
$$x^{[p]}_{i_{(n+1)}} = x^{[p]}_{i_{(n)}} - \Delta_{i_{(n)}} \quad \delta x^{[p]}_{i_{(n)}} \geq 0;$$
$$y^{[p]}_{i_{(n+1)}} = y^{[p]}_{i_{(n)}} + \Delta_{i_{(n)}} \quad \delta y^{[p]}_{i_{(n)}} < 0;$$
$$y^{[p]}_{i_{(n+1)}} = y^{[p]}_{i_{(n)}} - \Delta_{i_{(n)}} \quad \delta y^{[p]}_{i_{(n)}} \geq 0;$$
(3)

in which $$\delta x^{[p]}_{i_{(n)}} = \sum_{j}^{N} \exp\left(-\frac{d^{[s]}_{i,j(n)} + d^{[t]}_{i,j(t)}}{\alpha}\right) \cdot (x^{[s]}_j - x^{[t]}_{j(n)});$$

$$\delta y^{[p]}_{i_{(n)}} = \sum_{j}^{N} \exp\left(-\frac{d^{[s]}_{i,j(n)} + d^{[t]}_{i,j(t)}}{\alpha}\right) \cdot (y^{[s]}_j - y^{[t]}_{j(n)});$$
(4)

$$\Delta_{i_{(n)}} = \sum_{j=1}^{N} \exp\left(-\frac{(d^{S}_{i,j(n)} + d^{T}_{i,j(n)})}{\alpha}\right) \cdot |d^{S}_{i,j(n)} + d^{T}_{i,j(n)}|.$$
(2B)

$$d^{S}_{i,j(n)} = \sqrt{(x^{P}_{i_{(n)}} - x^{S}_j)^2 + (y^{P}_{i_{(n)}} - y^{S}_j)^2}$$
$$d^{T}_{i,j(n)} = \sqrt{(x^{P}_{i_{(n)}} - x^{T}_j)^2 + (y^{P}_{i_{(n)}} - y^{T}_j)^2}$$
(5)

and in which α is a deformation factor representing the quality of the land matter being simulated, such that the smaller α, the larger the effect of land deformation and vice versa. In stricter mathematical terms, α is the width of the bell of the negative exponential;

$x_i^P(n)$, $y_i^P(n)$ or $x_{i_{(n)}}^{[P]}$, $y_{i_{(n)}}^{[P]}$ are the coordinates of a point P indexed (i) of the array of points at the understep (n);

$x_{i_{(n+1)}}^{[P]}$, $y_{i_{(n+1)}}^{[P]}$ are the coordinates of a point P indexed (i) of the array of points at the understep (n+1);

$x_j^S$, $y_j^S$ or $x_j^{[S]}$, $y_j^{[S]}$ are the coordinates at the first time of measurements of the points representing the values of the parameters at the first time of measurement (time T=0);

$x_j^T(n)$, $y_j^T(n)$ or $x_{j_{(n)}}^{[t]}$, $y_{j_{(n)}}^{[t]}$ are the coordinates at the second time of measurements of the points representing the values of the parameters at the second time t of measurement (time T=t) and at the understep n;

$d_{ij}^S(n)$ or $(d_{i,j_{(n)}}^{[S]}$ is the distance of a point (i) of the array of points from the point in said array representing a measured parameter value at the initial instant of the understep (n), which point is defined as Source point of the understep (n);

$d_{ij}^T(n)$ or $d_{i,j_{(n)}}^{[t]}$ is the distance of a point (i) of the array of points from the point in said array representing a measured parameter value at the end instant of the understep (n), which point is defined as Target point of the understep (n);

and where:

$\Delta_{i_{(n)}}$ has the meaning of a quantity of potential energy accumulated by each point $P_i$ at each understep n, and $\Delta x_{i_{(n)}}^{[p]}$ and $\delta y_{i_{(n)}}^{[p]}$ is a function determining the sign of the potential energy contribution $\Delta_{i_{(n)}}$ at each understep n.

The displacement of the points of the array, which are equivalent of the points defined by the crossing points of the grid, can be visualized by displaying the deformation of the grid due to the displacement of those points according to the above equations.

Different zones of density of the points of the array and thus of the grid are generated by the displacement of the points $P_i$ and the different densities are a visual and numerical value that indicates the evolutionary condition of the process at the different zones of the grid or of the array of points at a certain step, that is, at a certain time from the time of origin t=0, which is the time of the first measurements of said parameters.

As it will appear more clearly in the following examples, the parameters can be a position in space or any other kind of measurable entity, which is typical for describing the process or the event, or which is a typical consequence of a process or of an event.

The mathematical engine of the model is an adaptive non linear system, which is well suited for simulating evolution of events or processes of the natural kind, and in which the relation between the parameters and their evolution in space and time cannot be represented by equations that can be solved.

As discussed above, practically any kind of event or process or any kind of device, plant or system can be represented by certain parameters. Those values are measurable and are typical for describing the status of the process of the event, or globally of the device, of the plant or of the system or of each one of the operative organs or units forming that device, plant or system. Once such parameters have been determined, a space can be always constructed in which the behavior of the event, or the process or of the device, plant or system can be represented by a map, in which the status of the process or event can be represented by a point and also the status or function of a device, a plant or a system or of certain selected operative organs or units can be represented by points on that map, those points having a certain position on the map as a function of the values of certain parameters.

Thus it appears clearly that the above general model and method for generating the model applies not only to events or processes or plants or systems having topographical representation, but also to any kind of event, process, device, plant or system having a behavior that can be represented by a map.

For simplicity sake, the following examples have a topographical character, because it helps in a better and easier understanding of the present invention.

In the following description, two examples are shown, which are two experiments allowing a comparison of empiric data acquired with the results of the simulation that is calculated and represented by means of the present model.

In the first example, the diffusion over a certain territory of an epidemic is considered. The data are indicated in the table of FIGS. 4A and 4B. In table of FIGS. 4A and 4B, a list of 54 locations defined by their names and their geographic coordinates is indicated. The starting number of infected people in each location is indicated in the first column n=0, these being the data measured at a first time. The empiric data measured at successive times are not listed in the table, but only the data computed by the model for each of the following steps and for each geographical location is listed. These data are the number of subjects infected at each location in the understeps n=1 to n=6. The last column indicates the total number of infected people at each location.

FIGS. 5 to 7 illustrates the graphic outputs of the model (left image) with a map indicating the propagation condition of the infection at a certain moment in the territory, which has been empirically measured at a certain second time different from the time of origin t=0.

The different locations, at which the number of infected people has to be computed and for which empiric data are known for comparison sake, are positioned on a Cartesian coordinate system according to their geographic position. A grid of points is defined and overlapped to the 54 points representing the geographic locations at which the number of infected people is measured and computed. The model is used to determine the variation of the number of infected people at each step n=1 to n=6, starting from the known condition at n=0 and using at least one or more additional measurements of the results of the number of infected people at the different locations. In this case the displacement, and the trajectory between different entity points which are the 54 location, and the number of infected people at the locations is determined by the different number of infected people at each location and at different times. What is displaced is the number of infected cases and thus the grid and the displacement of the array of points defined by the grid will give an image of evolution of the epidemic.

As it appears clearly from FIGS. 6 and 7, at the step n=1 the model has generated a grid distortion in which there are white areas, with low density of grid lines and thus points of the array (geographic points); regions where there is a high density of points and lines that are black, and regions where the grid has not been deformed or has been only slightly deformed. Those different regions can be understood if compared with the empirical map of propagation of the epidemic over the same territory, where the 54 locations representing the so called entity points have been chosen.

In the map of propagation of the epidemic, there are regions having different grey shades. The darker ones represent regions which are very susceptible to infection. The more clear is a region. the less susceptible to infection it has been.

Figure 5B:
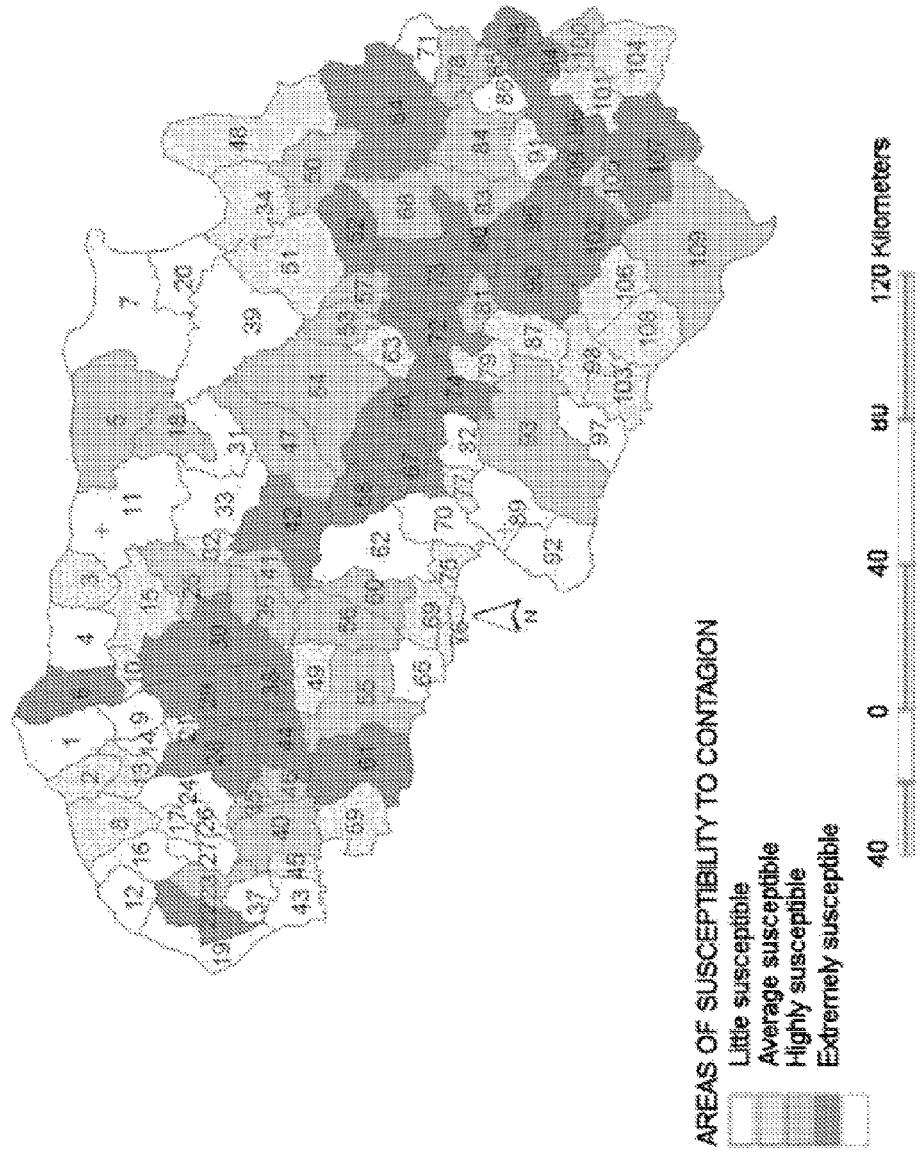

Considering the table of FIGS. 4A and 4B and the data on it, those of the 54 locations falling on the zones of the grid with the lowest density of grid lines (white zones) are the locations at which there has been the highest number of infected people, which coincides with the geographic regions considered to have the highest susceptibility to infection on the empiric data map of FIG. 5B.

The density of lines of the grid increases from said minimum density regions, and at certain points the lines of the grid are unchanged. The locations coinciding with the unchanged parts of the grid are locations, at which there is the lowest number of cases and the susceptibility to infection. The black part of the grid having the highest density of the lines of the grid represents barriers to the spreading of infection. These barriers can have different reasons, one of them being that the entire population of the region has been infected, so no more cases can occur.

Figure 6B:
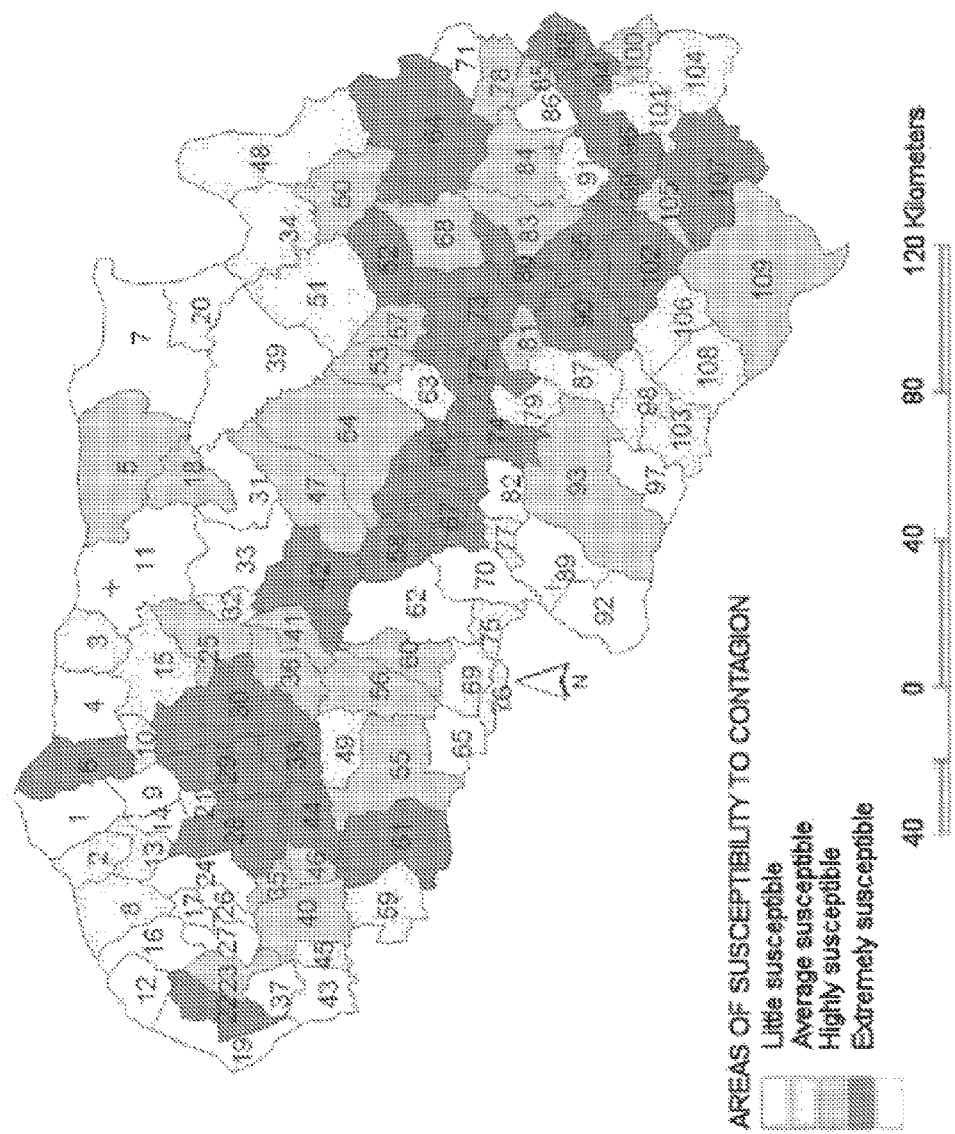
Figure 7A:
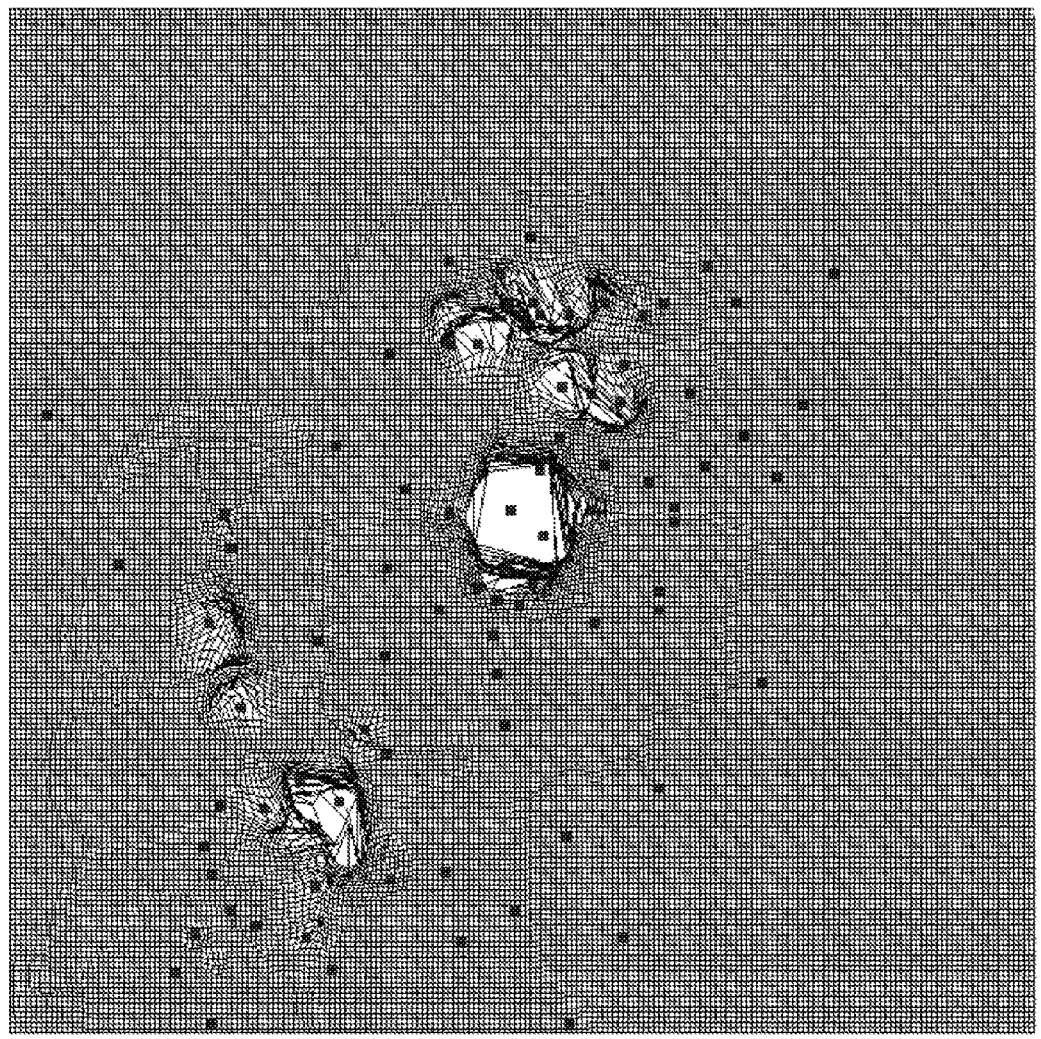
Figure 7B:
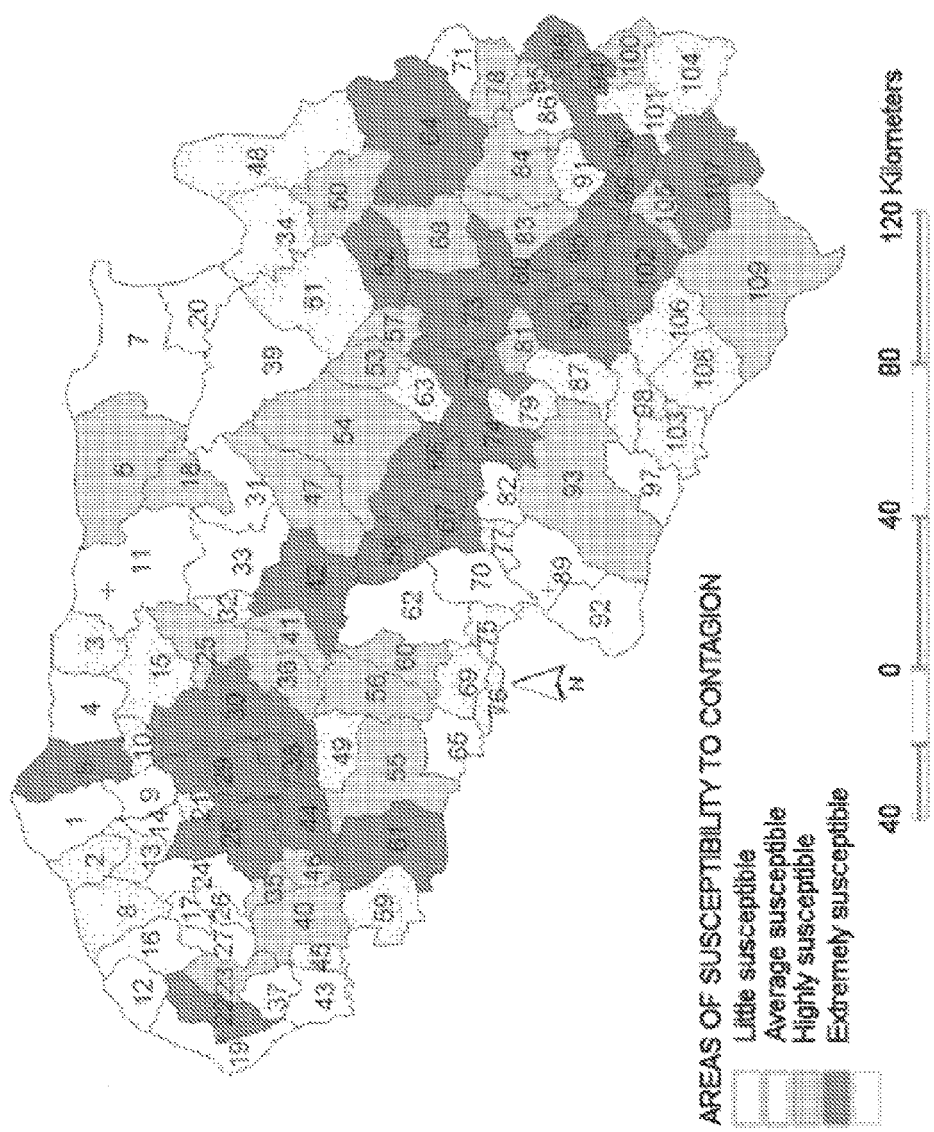

FIGS. 7A and 7B are analogous to FIGS. 6A and 6B, but the output grid of the model is illustrated for understeps n=0 to n=6. Here the comparison between output of the model and empiric map is more accurate than in the output grid of FIG. 6A.

An additional example is illustrated by means of FIGS. 8 to 15. The example relates to the use of the model according to the present invention for simulating a landslide interesting a big part of a territory, and particularly the town of Corvara (Italy) in the Alps. The slide has been monitored for several years by considering the displacements of position sensors (GPS sensors) located at a certain number of different geographic points at the time t=0, (step n=0), and by measuring the geographic coordinates and the height of those points.

At each successive measurement steps, at a second and additional times, the new geographic coordinate has been measured and the new height.

Figure 8:
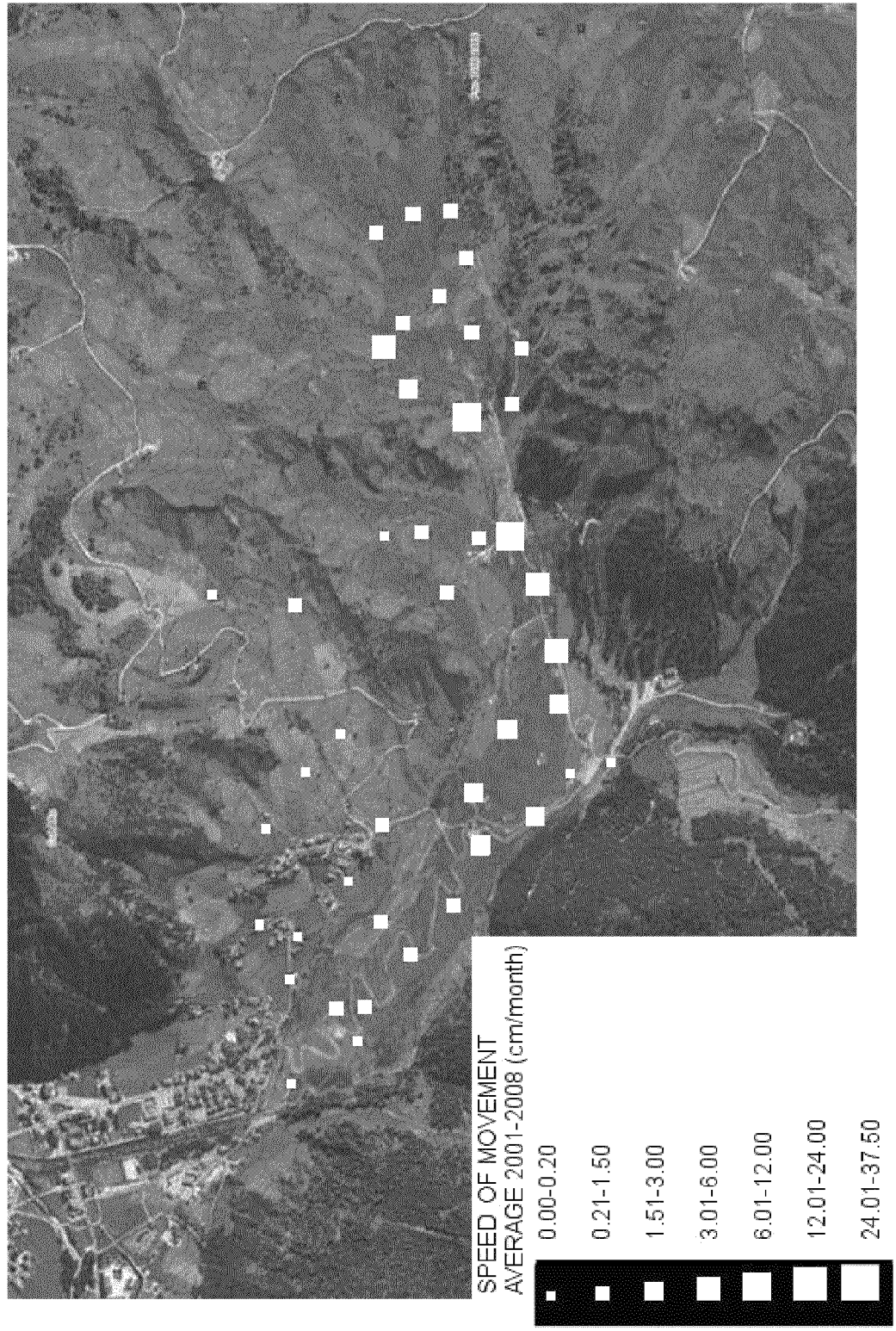
FIG. 8 illustrates an aerial view of the territory of Corvara (Italy) with tracked points on the map, on which a region interested by a landslide is highlighted. The position of the indicated points has been measured at several times, and on the map arrows also are shown having a length and thickness that is an indication of the value of the measured displacements of the landslide at the point where the arrow is illustrated on the map.

The map of FIG. 8 shows an aerial two dimensional image of the geographic region where the landslide is proceeding and the trajectory which the entity points, i.e. the points on the map at which the position sensors have been placed have run from the instant t=0 to an instant t=T, where t=0 corresponds to the first measurement step in 2001 and t=T to the last measurement step at t=T, where T is the year 2008.

The trajectory is in the form of an arrow. The origin of the arrow is the position of the entity point at t=0 and the apex of the arrow is the position of the entity point at t=T. The length of the arrow represents the distance from the position at t=0 from the position at t=T, and the thickness the mean velocity.

As it appears from the figure and from the legend, there are entity points which have carried out very fast and long paths and other points which did not change position or only slightly changed their position. Since only a certain number of points distributed over a very large territory could be monitored, a complete picture or description of what will happen at different regions of the territory due to the measured displacements of said specific entity points cannot be foreseen nor understood.

The measured data has been used to generate the model according to the present invention.

A grid representing the geographic position of certain generic points of the territory is generated. In a first step the grid is two dimensional and the entity points at which the displacement has been measured are also represented on the grid. The grid defines at the crossings of the vertical and horizontal lines points forming an array of points which is regular, i.e. the points have an uniform distribution at time t=0.

Figure 9A:
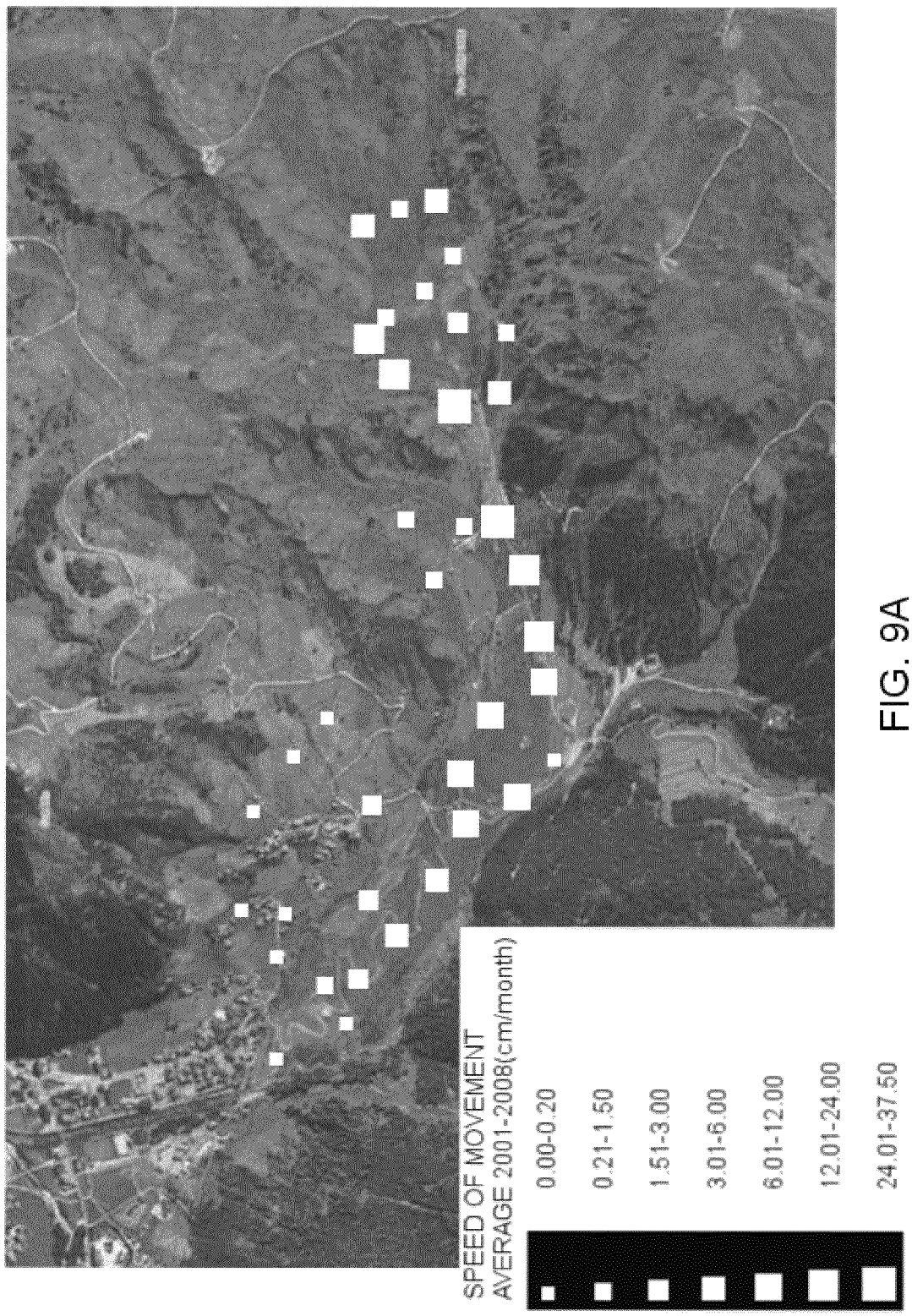
FIGS. 9A and 9B illustrate a comparison between the grid modification computed and visualized by the model and the aerial picture according to FIG. 8.
Figure 9B:
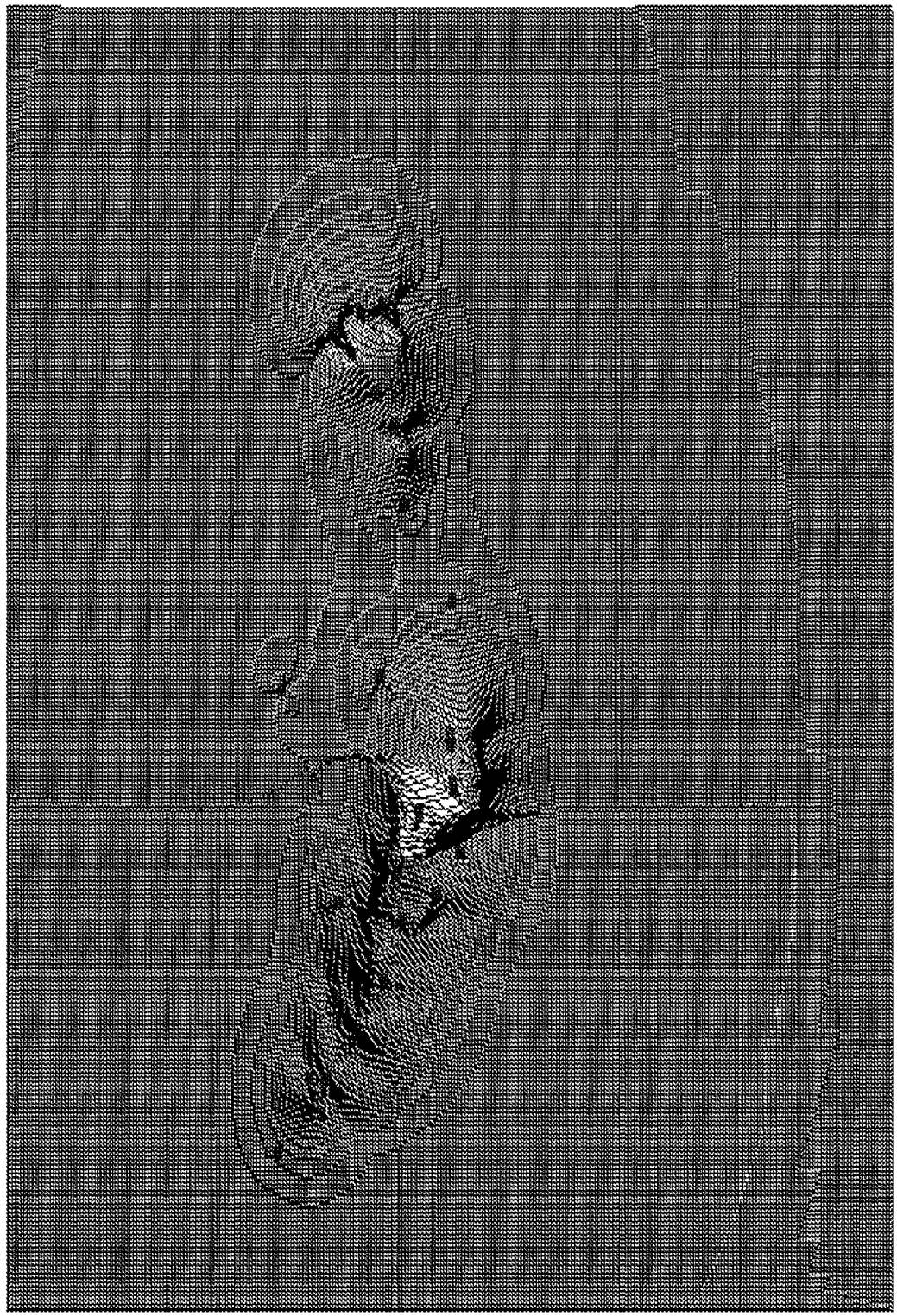

Applying the model according to the invention using the position data at different times of the entity points, the grid is deformed as illustrated in FIG. 9. The lower part of FIG. 9 represents the output grid of the model and the upper part the aerial picture of the region where the part of the territory presumably interested by the landslide is highlighted and where the displacement of the entity points as disclosed with reference of FIG. 8 is indicated.

Again there are three typical areas of the grid:

An area where the line density is lowest (white area);

An area where the line density is maximum (black area);

An area at which the grid has not been deformed and has essentially maintained its regular shape.

All these areas are interconnected by areas where the density of the grid lines increases from the lowest density areas to the highest density areas or to the area where the grids has maintained essentially its original shape or areas where the density decreases from the highest density areas to the lowest density areas or to the areas where the grid has maintained essentially its original shape.

FIG. 10 illustrates an enlarged view of the grid and of the aerial picture of FIG. 9 which is the zone of the grid and of the map at which the entities are positioned having undergone the maximum displacement. As it appears clearly there is a very good correspondence of the data on the aerial picture with the one of the model.

Figure 11:
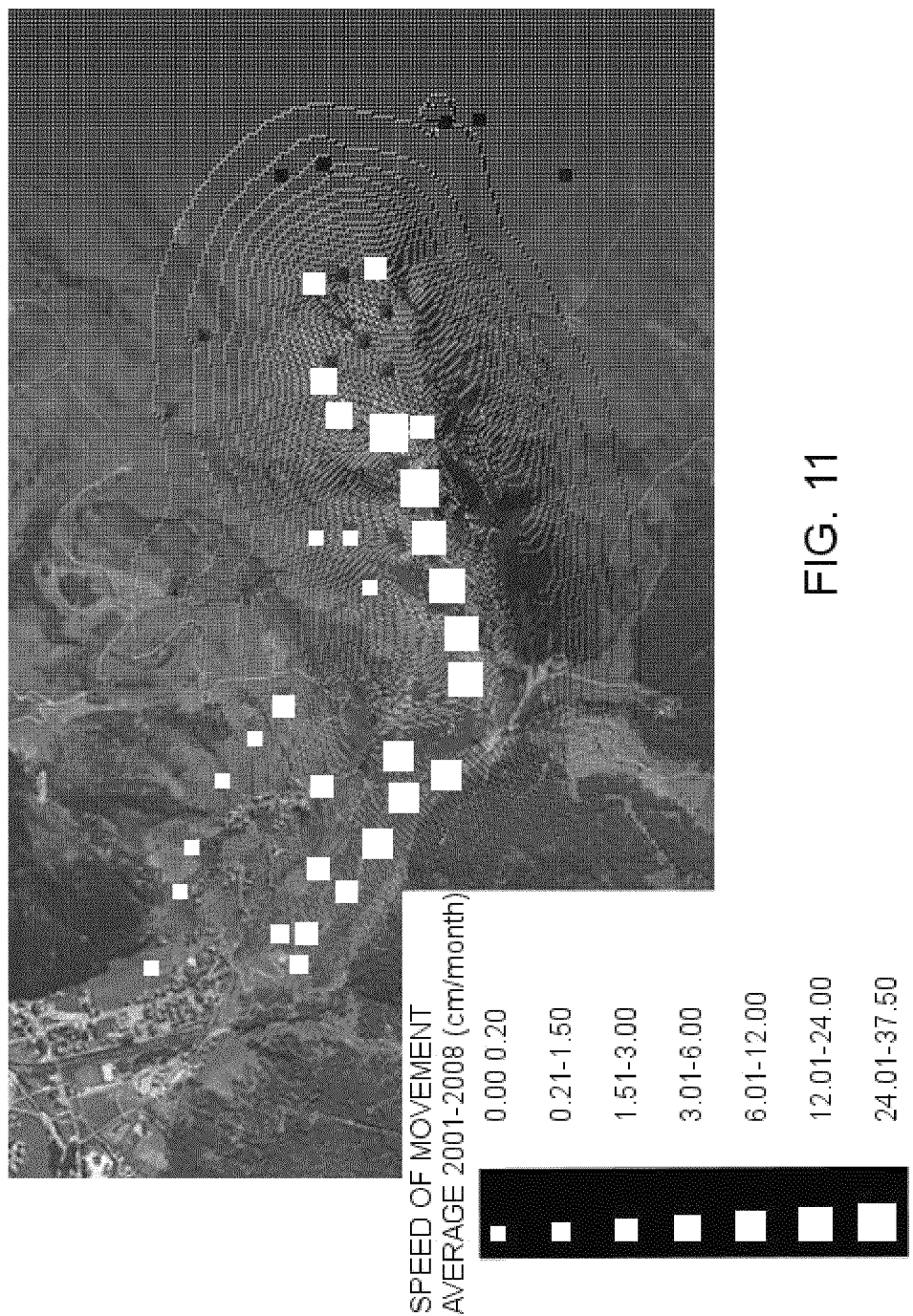
FIG. 11 illustrates the grid and the map in an overlapped and registered position.

FIG. 11 shows the output grid of FIG. 9 overlapped to the aerial picture, the grid being rescaled to fit the scale of the aerial picture and the coordinate systems of the grid and of the picture being brought into register one with the other in order to have the positions of the entity points on the grid at t=0 correspond with the positions of the entity points on the picture at t=0.

As it appears clearly, there is a congruence of the zones having the lowest density of lines of the grid in the output grid with the regions in the picture where the GPS sensors located at the entity points has undergone the strongest displacements.

Figure 12:
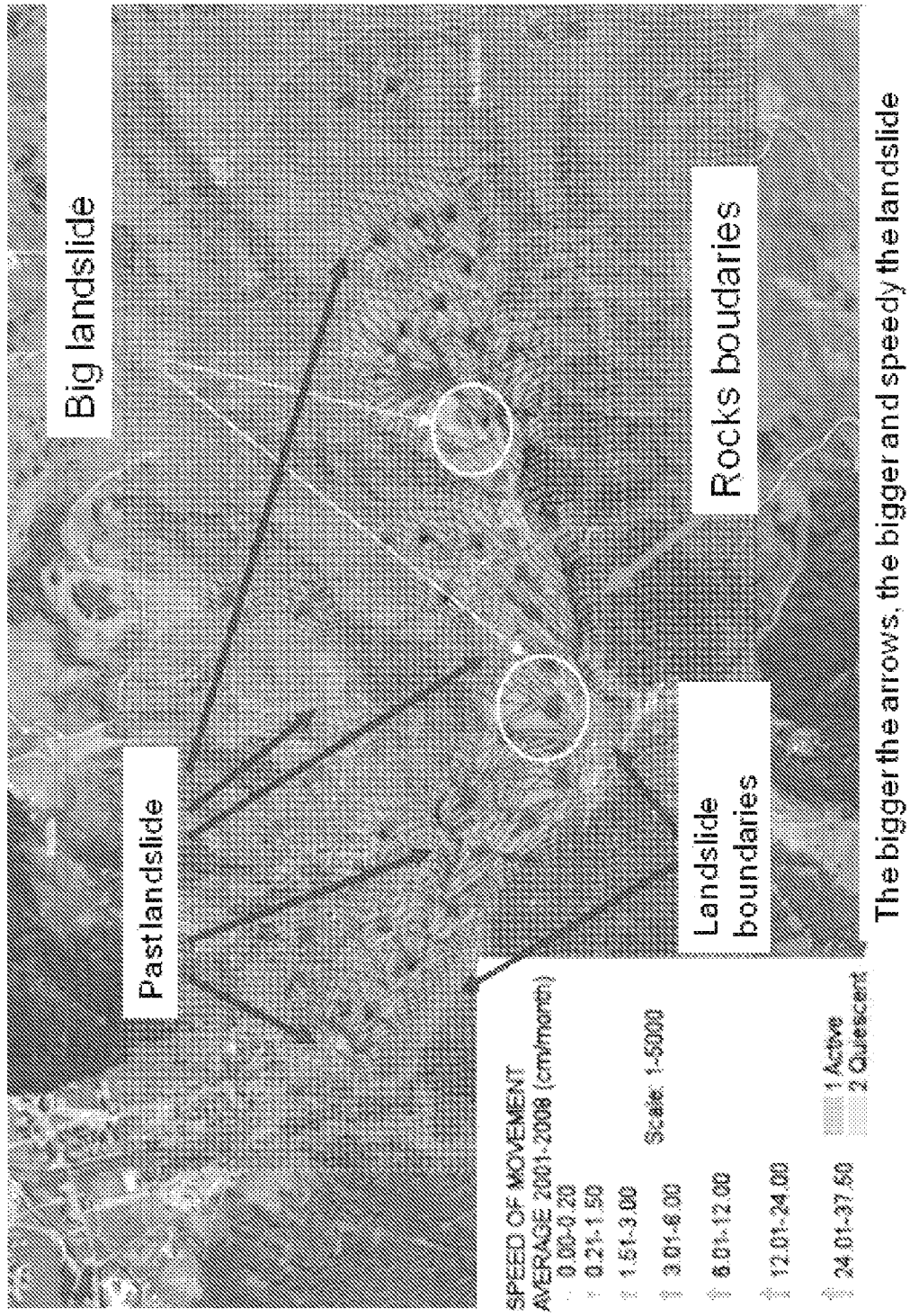
FIG. 12 is an enlargement of FIG. 11 with the indication of particular features which have been discovered by the model and have a correspondence in the natural configuration of the landscape and in the geological structure of the territory.

FIG. 12 introduces explanations to the different areas of the output grid having different deformations and line density.

Figure 13:
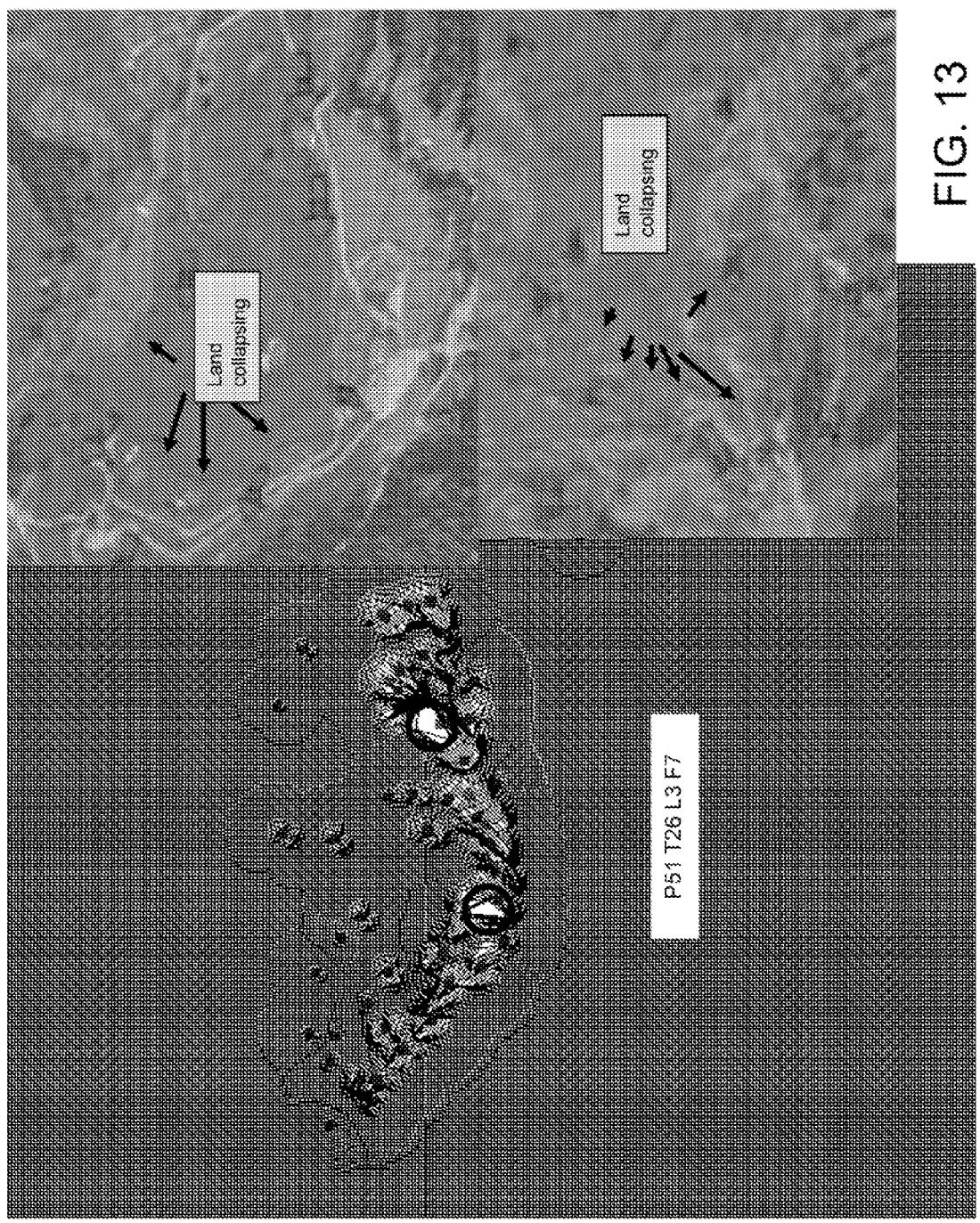
FIG. 13 is a comparison of the output grid of the model and two enlarged particulars of the map which correspond to two different zones highlighted on the grid.
Figure 14:
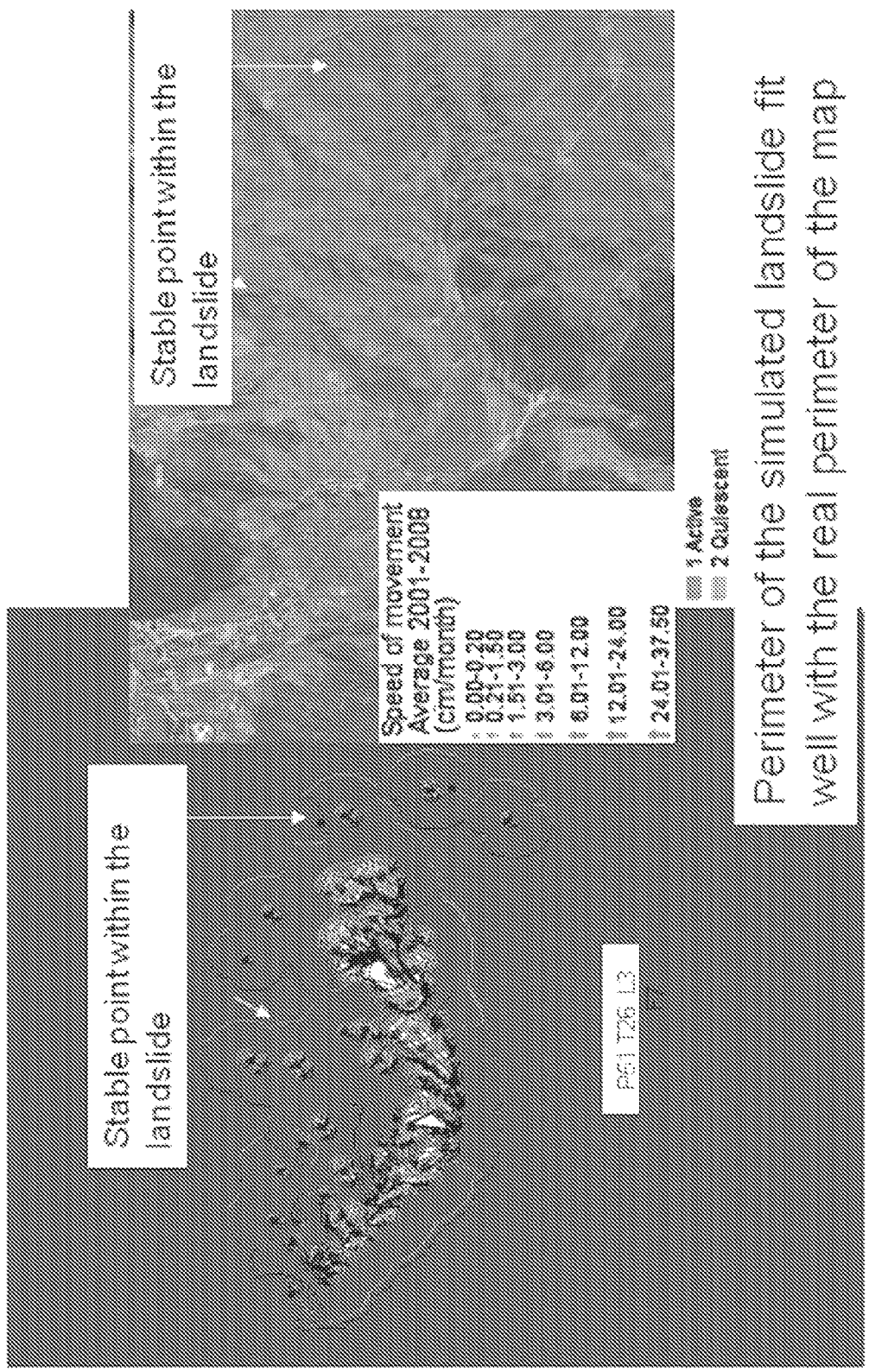
FIG. 14 is a further comparison of the output grid of the model and the map of the real situation where the points are indicated, which are considered stable by the model and compared with the real situation on the territory.

In FIGS. 13 and 14, these areas are further displayed with an enlarged view and isolated from the other areas.

The different densities of the grid lines and the essential invariance of the grid has been found out by comparing the area of the grid with the corresponding features of the territory and of the region interested by the landslide.

In accordance with the findings of the previous example relating to the spreading of the epidemic, in the present example, the regions having less density of the grid lines (white areas of the grid) are the regions where the strongest displacements have occurred.

The regions where the density of the grid lines has its maximum are the regions where there are boundaries of the landslide impeding any further displacement.

The regions where the grid is essentially identical to the one at the time t=0 are the regions where no displacement has occurred but where no natural boundary exists to a displacement.

FIG. 13 explicitly indicates the areas of lowest density of the lines of the output grid and the enlarged views of the corresponding parts of the picture of the territory, with the GPS sensors and the arrows indicating the strength of the displacement of said sensors measured in the time period from 2001 to 2008.

Similarly, FIG. 14 illustrates the regions where the GPS sensors and the output grid indicate that no displacement has occurred. These are the boundaries of the landslide. Here the geology of the territory is not such to set limits to the slide, but simply the displacements of the earth masses in the other regions subjected to the sliding of the earth masses have no effect on the region where no such displacement is determined.

Figure 15:
FIGS. 15 and 16 illustrate the three dimensional model by visualizing the three dimensional grid represented by a perspective view of the grid matched and overlapped and registered with a three dimensional view of the territory represented by a perspective photograph.
Figure 16:

As illustrated in FIGS. 15 and 16, the grid in a three dimensional perspective view can give information about the three dimensional shaping of the territory. In FIGS. 15 and 16, this is demonstrated by visualizing in an overlapped manner a 3D perspective view of the grid and of the corresponding zone of the territory also in and identical perspective picture.

As it appears clearly, the regions of maximum strength of displacement (lowest density of the grid lines in the output grid of the model) are the ones having the strongest gravitational effect, so steep descending slopes. In the regions where there are limits to the sliding and which correspond to the areas of the output grid of the model where the density of the grid lines is a maximum (black areas), the territory shows steep rising slopes or rocks or other geological structures that are highly resistant or also artificial limitations due to constructions made by man, such as roads, containment walls or other kind of constructions.

The above described examples are related to the evaluation of the propagation or development of events or processes in time and space which have e geographical relation, in the sense that the points, where the parameter are measured and the displacements of these points and equally the array of generic points, are related to locations on a map of a territory defined by its geographic coordinates.

Nevertheless, in considering other kind of processes or events which do not have a relation to a certain location on the territory, a space of variables having values that define the condition of the process or the effects of the event in time can be created and the model can be applied in this space that has no relation to a geographical system but is a virtual space describing the conditions of a system.

For example, considering an industrial plant and the parameters describing the conditions or state of the plant in relation to its functionality, a space can be constructed having a dimension corresponding to the number of different parameters, each point being univocally defined by the number of parameters having the meaning of coordinates in that space for that point. Describing the plant functions with such a virtual space allows using the present model for simulating the behavior of the plant in different conditions as a function of the measurement of the parameters at different times.

From the above description it is possible to extrapolate the more general equations of the model according to the present invention, which describes the mathematical engine of the model for a n-dimensional case in which n is a natural number starting from 2.

The more generic expressions of the mathematical equations expressed with reference to the two dimensional case in the above description is an extension of said equations related to the two dimensional case.

According to this n-dimensional extension, the computation of the position of the points of the array of points at a certain time as a function of the measured values of the parameters at least at a first and at a second successive time is carried out according to the following equations:

$$P_i(n+1) = P_i(n) + \text{Delta}_i(n) \quad (1)$$

in which $P_i(n)$ is the position of the i-th point in the grid at the step n, n being the index number of a step of a certain number of steps in which divided the displacements is divided of the points representing the measured parameters and the time interval between a first time of measurement and a second time of measurement, during which interval said displacements has occurred;

$P_i(n+1)$ is the position of the i-th point in the grid at the step n+1;

$\text{Delta}_i(n)$ is defined by the following equation:

$$\text{Delta}_i(n) = \sum_{j=1}^{N} \exp\left\{-\frac{(d_{ij}^S(n) + d_{ij}^T(n))}{v}\right\} \cdot |d_{ij}^S(n) + d_{ij}^T(n)| \quad (2)$$

in which:

$d_{ij}^S(n)$ is the distance of a point (i) of the array of points from the point in said array representing a measured parameter value at the initial instant of the understep (n), that point being defined as Source point of the understep (n); and $d_{ij}^T(n)$ is the distance of a point (i) of the array of points from the point in said array representing a measured parameter value at the end instant of the understep (n), that point being defined as Target point of the understep (n).

What is claimed is:

1. A model simulating evolutionary dynamics of events or processes, said model comprising:

a non linear adaptive mathematical system simulating spatial and temporal dynamics of an event or process by using measured values of a certain number of parameters describing an evolutionary condition of the event or process at certain different times;

the values of said parameters being measured at a first time and at least a second time different from and following said first time;

said model defining a multi-dimensional array of geometrical points in a multi-dimensional reference system having an axis that represents the values of the parameters being measured, said parameters in said array being represented by entity points in said array of geometrical points;

displacements of each one of the geometrical points of said array being computed as a function of the displacements in said array of each of the entity points between a first time of measurement and at least a successive second time of measurement and as a function of a distance of each of the geometrical points of the array from each of the entity points;

the evolution of the event and/or the model in time being visualized by displaying, on a display device, the geometrical points of the array at different times.

2. The model of claim 1, wherein the multi-dimensional array of geometrical points is represented by a multi-dimensional grid in which the geometrical points of the array are crossing points of lines delimiting meshes of the grid, and wherein the evolutionary condition of the event or process at a certain time is visualized as a distortion of the grid determined by changes in relative position of the geometrical points of the array from a starting position in which the geometrical points of the array are equally spaced one from the other to the position of said geometrical points of the array computed at said certain time.

3. The model of claim 1, wherein a certain mesh size is set.

4. The model of claim 1, wherein the array is two or three dimensional.

5. The model of claim 2, wherein the grid is two or three dimensional.

6. The model of claim 1, wherein the evolution between a first time at which parameters are first measured and a second time at which the parameters are measured an additional time is divided in a certain number of steps, the displacements of the entity points and a time interval during which said displacements has occurred being divided by said certain number of steps.

7. The model of claim 1, wherein the computation of a position of the geometrical points of the array at a certain time as a function of the measured values of the parameters at least at a first and at a second successive time is carried out according to the following equations:

$$P_i(n+1) = P_i(n) + \text{Delta}_i(n)$$

in which $P_i(n)$ is a position of the i-th point in the grid at an understep n, n is an index number of a step of a certain number of steps in which the displacements are divided of the entity points along a time interval between a first time of measurement and a second time of measurement, said displacements having occurred during said time interval;

$P_i(n+1)$ is a position of the i-th point in the grid at an understep n+1;

$\text{Delta}_i(n)$ is defined by the following equation:

$$\text{Delta}_i(n) = \sum_{j=1}^{N} \exp\left\{-\frac{(d_{ij}^S(n) + d_{ij}^T(n))}{v}\right\} \cdot |d_{ij}^S(n) + d_{ij}^T(n)|$$

in which:

$d_{ij}^S(n)$ is a distance of a point (i) of the array of geometrical points from the entity point in said array representing a measured parameter value at an initial instant of an understep (n), said point being defined as Source point of the understep (n); and $d_{ij}^T(n)$ is a distance of a point (i) of the array of geometrical points from the entity point in said array representing a measured parameter value at an end instant of the understep (n), said point being defined as Target point of the understep (n).

8. The model of claim 1, wherein the model is a two dimensional model in which the computation of a position of the geometrical points of the array at a certain time as a function of the measured values of the parameters at least at a first and at a second successive time is carried out according to the following equations:

$$\left. \begin{array}{l} x_{i_{(n+1)}}^{[p]} = x_{i_{(n)}}^{[p]} + \Delta_{i_{(n)}} \quad \delta x_{i_{(n)}}^{[p]} < 0; \\ x_{i_{(n+1)}}^{[p]} = x_{i_{(n)}}^{[p]} - \Delta_{i_{(n)}} \quad \delta x_{i_{(n)}}^{[p]} \geq 0; \\ y_{i_{(n+1)}}^{[p]} = y_{i_{(n)}}^{[p]} + \Delta_{i_{(n)}} \quad \delta y_{i_{(n)}}^{[p]} < 0; \\ y_{i_{(n+1)}}^{[p]} = y_{i_{(n)}}^{[p]} - \Delta_{i_{(n)}} \quad \delta y_{i_{(n)}}^{[p]} \geq 0. \end{array} \right\}$$

in which $$\left. \begin{array}{l} \delta x_{i_{(n)}}^{[p]} = \sum_{j}^{N} \exp\left(-\frac{d_{i,j_{(n)}}^{[s]} + d_{i,j_{(t)}}^{[t]}}{\alpha}\right) \cdot (x_j^{[s]} - x_{j_{(n)}}^{[t]}); \\ \delta y_{i_{(n)}}^{[p]} = \sum_{j}^{N} \exp\left(-\frac{d_{i,j_{(n)}}^{[s]} + d_{i,j_{(t)}}^{[t]}}{\alpha}\right) \cdot (y_j^{[s]} - y_{j_{(n)}}^{[t]}); \\ \Delta_{i_{(n)}} = \sum_{j=1}^{N} \exp\left(-\frac{(d_{i,j_{(n)}}^{S} + d_{i,j_{(n)}}^{T})}{\alpha}\right) \cdot |d_{i,j_{(n)}}^{S} + d_{i,j_{(n)}}^{T}|. \\ d_{i,j_{(n)}}^{S} = \sqrt{(x_{i_{(n)}}^{P} - x_j^{S})^2 + (y_{i_{(n)}}^{P} - y_j^{S})^2} \\ d_{i,j_{(n)}}^{T} = \sqrt{(x_{i_{(n)}}^{P} - x_j^{T})^2 + (y_{i_{(n)}}^{P} - y_j^{T})^2} \end{array} \right\}$$

n is an index number of a step of a certain number of steps in which the displacements are divided of the entity points along a time interval between a first time of measurement and a second time of measurement, said displacements having occurred during said time interval, α is a deformation factor representing a quality of land matter being simulated, and in which $x_i^P(n)$, $y_i^P(n)$ or $x_{i_{(n)}}^{[P]}$, $y_{i_{(n)}}^{[P]}$ are coordinates of a point P indexed (i) of the array of geometrical points at an understep (n);

$x_{i_{(n+1)}}^{[P]}$, $y_{i_{(n+1)}}^{[P]}$ are coordinates of a point P indexed (i) of the array of geometrical points at the understep (n+1);

$x_j^S$, $y_j^S$ or $x_j^{[S]}$, $y_j^{[S]}$ are coordinates at the first time of measurements of the entity points at the first time of measurement (time T=0);

$x_j^T(n)$, $y_j^T(n)$ or $x_{j_{(n)}}^{[t]}$, $y_{j_{(n)}}^{[t]}$ are coordinates at the second time of measurements of the entity points at the second time t of measurement (time T=t) and at the understep n;

$d_{ij}^S(n)$ or $d_{i,j_{(n)}}^{[S]}$ is a distance of a point (i) of the array of geometrical points from the entity point in said array representing a measured parameter value at the initial instant of the understep (n) which point is defined as Source point of the understep (n);

$d_{ij}^T(n)$ or $d_{i,j_{(n)}}^{[t]}$ is a distance of a point (i) of the array from the entity point in said array representing a measured parameter value at the end instant of the understep (n), said entity point being defined as Target point of the understep (n);

and where:

$\Delta_{i_{(n)}}$ has a meaning of a quantity of potential energy accumulated by each point $P_i$ at each understep n; and $\delta x_{i_{(n)}}^{[p]}$ and $\delta y_{i_{(n)}}^{[p]}$ is a function for determining a sign of a potential energy contribution $\Delta_{i_{(n)}}$ at each understep n.

9. The model of claim 1, wherein the model describes a landslide, the measured values of parameters being entity points of measurements of displacement of a certain number of geographical points in a certain region, each of the geographical points having known coordinate at time t=0 and new coordinates at each of one or more successive measurement times, while the array of geometrical points is formed by generic geometrical points of a territory forming crossing points of lines of a grid describing generic points of said territory.

10. The model of claim 1, wherein the model describes the propagation of an epidemy, wherein the measured values of the parameters are the number of subjects infected at certain location on a territory having known coordinates, and wherein the territory is represented by an array of geometrical points forming crossing points of lines of a grid describing generic points of said territory.

11. A method of generating a model simulating evolutionary dynamics of events or processes, said model comprising:

providing a non linear adaptive mathematical system simulating spatial and temporal dynamics of an event or process by using measured values of a certain number of parameters describing an evolutionary condition of the event or process at certain different times;

the values of said parameters being measured at a first time and at least a second time different from and following said first time;

defining a multi-dimensional array of geometrical points in a multi-dimensional reference system having an axis that represents the values of the parameters being measured, said parameters in said array being represented by entity points in said array of geometrical points;

computing displacements of each of the geometrical points of said array as a function of the displacements in said array of each of the entity points between a first time of measurement and at least a successive second time of measurement and as a function of a distance of each of the geometrical points of the array from each of the entity points; and visualizing the evolution of the event and/or the model in time by displaying, on a display device, the geometrical points of the array at different times.

12. The method of claim 11, wherein the multi-dimensional array of points is represented by a multi-dimensional grid in which the geometrical points of the array are crossing points of lines delimiting meshes of the grid, and wherein the evolutionary condition of the event or process at a certain time is visualized as a distortion of the grid determined by changes in relative position of the geometrical points of the array from a starting position in which the geometrical points of the array are equally spaced one from the other to the position of said geometrical points of the array computed at said certain time.

13. The method of claim 11, wherein a certain mesh size is set.

14. The method of claim 11, wherein the array is two or three dimensional.

15. The method of claim 11, wherein the grid is two or three dimensional.

16. The method of claim 11, wherein the evolution between a first time at which parameters are first measured and a second time at which the parameters are measured an additional time is divided in a certain number of steps, the displacements of the entity points and a time interval during which said displacements has occurred being divided by said certain number of steps.

17. The method of claim 11, wherein the computation of a position of the points of the array of points at a certain time as a function of the measured values of the parameters at least at a first and at a second successive time is carried out according to the following equations:

$$P_i(n+1) = P_i(n) + \text{Delta}_i(n) \quad (1),$$

in which $P_i(n)$ is a position of the i-th point in the grid at the understep n, n being an index number of a step of a certain number of steps, in which the displacements of the points representing the measured parameters are divided and a time interval between a first time of measurement and a second time of measurement and during which interval said displacements has occurred;

$P_i(n+1)$ is a position of the i-th point in the grid at the understep n+1;

$\text{Delta}_i(n)$ is defined by the following equation:

$$\text{Delta}_i(n) = \sum_{j=1}^{N} \exp\left\{-\frac{(d_{ij}^S(n) + d_{ij}^T(n))}{v}\right\} \cdot |d_{ij}^S(n) + d_{ij}^T(n)|$$

in which:

$d_{ij}^S(n)$ is a distance of a point (i) of the array of points from the point in said array representing a measured parameter value at an initial instant of an understep (n), said point being defined as Source point of the understep (n); and $d_{ij}^T(n)$ is the distance of a point (i) of the array of points from the point in said array representing a measured parameter value at an end instant of the understep (n), said point being defined as target point of the understep (n).

18. The method of claim 11, wherein the model is a two dimensional model, and wherein the computation of a position of the points of the array of points at a certain time as a function of the measured values of the parameters at least at a first and at a second successive time is carried out according to the following equations:

$$\left.\begin{array}{ll}x_{i_{(n+1)}}^{[p]} = x_{i_{(n)}}^{[p]} + \Delta_{i_{(n)}} & \delta x_{i_{(n)}}^{[p]} < 0; \\ x_{i_{(n+1)}}^{[p]} = x_{i_{(n)}}^{[p]} - \Delta_{i_{(n)}} & \delta x_{i_{(n)}}^{[p]} \geq 0; \\ y_{i_{(n+1)}}^{[p]} = y_{i_{(n)}}^{[p]} + \Delta_{i_{(n)}} & \delta y_{i_{(n)}}^{[p]} < 0; \\ y_{i_{(n+1)}}^{[p]} = y_{i_{(n)}}^{[p]} - \Delta_{i_{(n)}} & \delta y_{i_{(n)}}^{[p]} \geq 0.\end{array}\right\}$$

in which:

$$\left.\begin{array}{l}\delta x_{i_{(n)}}^{[p]} = \sum_{j}^{N} \exp\left(-\frac{d_{i,j_{(n)}}^{[s]} + d_{i,j_{(t)}}^{[t]}}{\alpha}\right) \cdot (x_j^{[s]} - x_{j_{(n)}}^{[t]}); \\ \delta y_{i_{(n)}}^{[p]} = \sum_{j}^{N} \exp\left(-\frac{d_{i,j_{(n)}}^{[s]} + d_{i,j_{(t)}}^{[t]}}{\alpha}\right) \cdot (y_j^{[s]} - y_{j_{(n)}}^{[t]});\end{array}\right\}$$

-continued $$\Delta_{i_{(n)}} = \sum_{j=1}^{N} \exp\left(-\frac{(d_{i,j_{(n)}}^{S} + d_{i,j_{(n)}}^{T})}{\alpha}\right) \cdot |d_{i,j_{(n)}}^{S} + d_{i,j_{(n)}}^{T}|.$$

$$d_{i,j_{(n)}}^{S} = \sqrt{(x_{i_{(n)}}^{P} - x_{j}^{S})^{2} + (y_{i_{(n)}}^{P} - y_{j}^{S})^{2}}$$

$$d_{i,j_{(n)}}^{T} = \sqrt{(x_{i_{(n)}}^{P} - x_{j}^{T})^{2} + (y_{i_{(n)}}^{P} - y_{j}^{T})^{2}}$$

n is an index number of a step of a certain number of steps in which the displacements are divided of the entity points along a time interval between a first time of measurement and a second time of measurement, said displacements having occurred during said time interval, α is a deformation factor representing a quality of land matter being simulated, and in which $x_i^P(n)$, $y_i^P(n)$ or $x_{i_{(n)}}^{[P]}$, $y_{i_{(n)}}^{[P]}$ are coordinates of a point P indexed (i) of the array of points at an understep (n);

$x_{i_{(n+1)}}^{[P]}$, $y_{i_{(n+1)}}^{[P]}$ are coordinates of a point P indexed (i) of the array of points at the understep (n+1);

$x_j^S$, $y_j^S$ or $x_j^{[S]}$, $y_j^{[S]}$ are coordinates at the first time of measurements of the points representing the values of the parameters at the first time of measurement (time T=0);

$x_j^T(n)$, $y_j^T(n)$ or $x_{j_{(n)}}^{[t]}$, $y_{j_{(n)}}^{[t]}$ are coordinates at the second time of measurements of the points representing the values of the parameters at the second time t of measurement (time T=t) and at the understep n;

$d_{ij}^{S}(n)$ or $d_{i,j_{(n)}}^{[S]}$ is a distance of a point (i) of the array of points from the point in said array representing a measured parameter value at the initial instant of the understep (n), said point being defined as Source point of the understep (n);

$d_{ij}^{T}(n)$ or $d_{i,j_{(n)}}^{[t]}$ is a distance of a point (i) of the array of points from the point in said array representing a measured parameter value at the end instant of the understep (n), said point being defined as Target point of the understep (n);

and in which:

$\Delta_{i_{(n)}}$ has a meaning of a quantity of potential energy accumulated by each point $P_i$ at each understep n; and $\delta x_{i_{(n)}}^{[P]}$ and $\delta y_{i_{(n)}}^{[P]}$ is a function determining a sign of a potential energy contribution $\Delta_{i_{(n)}}$ at each understep n.

19. The method of claim 11, wherein the model is used to calculate and display the evolution of a landslide, by displacement measurements of a certain number of points on a territory ad at a sequence of successive times, while the array of points is formed by generic geometrical points of the territory forming crossing points of lines of a grid describing generic points of said territory.

20. The model of claim 11, wherein the model is used for calculating and displaying the propagation of an epidemic in time on a territory, wherein the measured values of the parameters are the number of subjects infected at certain location on the territory having known coordinates, and wherein the territory is represented by an array of geometrical points forming crossing points of lines of a grid describing generic points of said territory.

* * * * *